(12) United States Patent
Augustine et al.

(10) Patent No.: US 11,908,542 B2
(45) Date of Patent: Feb. 20, 2024

(54) ENERGY EFFICIENT MEMORY ARRAY WITH OPTIMIZED BURST READ AND WRITE DATA ACCESS

(71) Applicant: Intel Corporation, Santa Clara, CA (US)

(72) Inventors: Charles Augustine, Portland, OR (US); Somnath Paul, Hillsboro, OR (US); Turbo Majumder, Portland, OR (US); Iqbal Rajwani, Roseville, CA (US); Andrew Lines, Portland, OR (US); Altug Koker, El Dorado Hills, CA (US); Lakshminarayanan Striramassarma, Folsom, CA (US); Muhammad Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 164 days.

(21) Appl. No.: 16/725,747

(22) Filed: Dec. 23, 2019

(65) Prior Publication Data
US 2021/0193196 A1 Jun. 24, 2021

(51) Int. Cl.
*G11C 7/10* (2006.01)
*G11C 7/12* (2006.01)
*G11C 7/22* (2006.01)

(52) U.S. Cl.
CPC .......... *G11C 7/1048* (2013.01); *G11C 7/1006* (2013.01); *G11C 7/12* (2013.01); *G11C 7/22* (2013.01)

(58) Field of Classification Search
CPC ... G11C 7/1015; G11C 7/1021; G11C 7/1048; G11C 7/12; G11C 7/22; G11C 2013/0085; G11C 2013/0088; G11C 7/1006
See application file for complete search history.

(56) References Cited

U.S. PATENT DOCUMENTS

| 6,462,997 B2 * | 10/2002 | Sugamoto | G11C 11/4096 365/203 |
| 7,304,908 B2 * | 12/2007 | Suh | G11C 7/1087 365/230.03 |
| 8,929,129 B2 * | 1/2015 | Yamamoto | G11C 11/4091 365/230.06 |

(Continued)

OTHER PUBLICATIONS

Extended European Search Report notified Feb. 19, 2021 for EP Patent Application No. 20192537.7-1203.

*Primary Examiner* — Vanthu T Nguyen
(74) *Attorney, Agent, or Firm* — Schwabe, Williamson & Wyatt, P.C.

(57) ABSTRACT

Prior knowledge of access pattern is leveraged to improve energy dissipation for general matrix operations. This improves memory access energy for a multitude of applications such as image processing, deep neural networks, and scientific computing workloads, for example. In some embodiments, prior knowledge of access pattern allows for burst read and/or write operations. As such, burst mode solution can provide energy savings in both READ (RD) and WRITE (WR) operations. For machine learning or inference, the weight values are known ahead in time (e.g., inference operation), and so the unused bytes in the cache line are exploited to store a sparsity map that is used for disabling read from either upper or lower half of the cache line, thus saving dynamic capacitance.

20 Claims, 24 Drawing Sheets

(56) References Cited

U.S. PATENT DOCUMENTS

| | | | |
|---|---|---|---|
| 9,384,826 B2* | 7/2016 | Roine | G11C 11/4094 |
| 9,613,685 B1* | 4/2017 | Seetharaman | G11C 11/419 |
| 9,741,430 B2* | 8/2017 | Menezes | G11C 11/418 |
| 9,824,749 B1* | 11/2017 | Nautiyal | G11C 11/413 |
| 9,967,608 B2* | 5/2018 | Piepenbrink | H04N 21/41407 |
| 2012/0134198 A1 | 5/2012 | Yamaguchi et al. | |
| 2019/0198093 A1 | 6/2019 | Khellah et al. | |

* cited by examiner

ENERGY EFFICIENT MEMORY ARRAY WITH OPTIMIZED BURST READ AND WRITE DATA ACCESS

BACKGROUND

Many applications such as graphics, deep learning, machine learning, artificial intelligence processing etc., use static random access memory (SRAM) to save weights for training and trained weights. Conventionally, six transistor (6T) SRAM is designed without any knowledge of access pattern, i.e., for random access pattern. Further, memory read contributes significant dynamic capacitance (Cdyn) to a matrix-vector multiplication kernel that is crucial to evaluating various deep neural network (DNN) topologies such as convolution, fully-connected or recurrent-neural networks.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
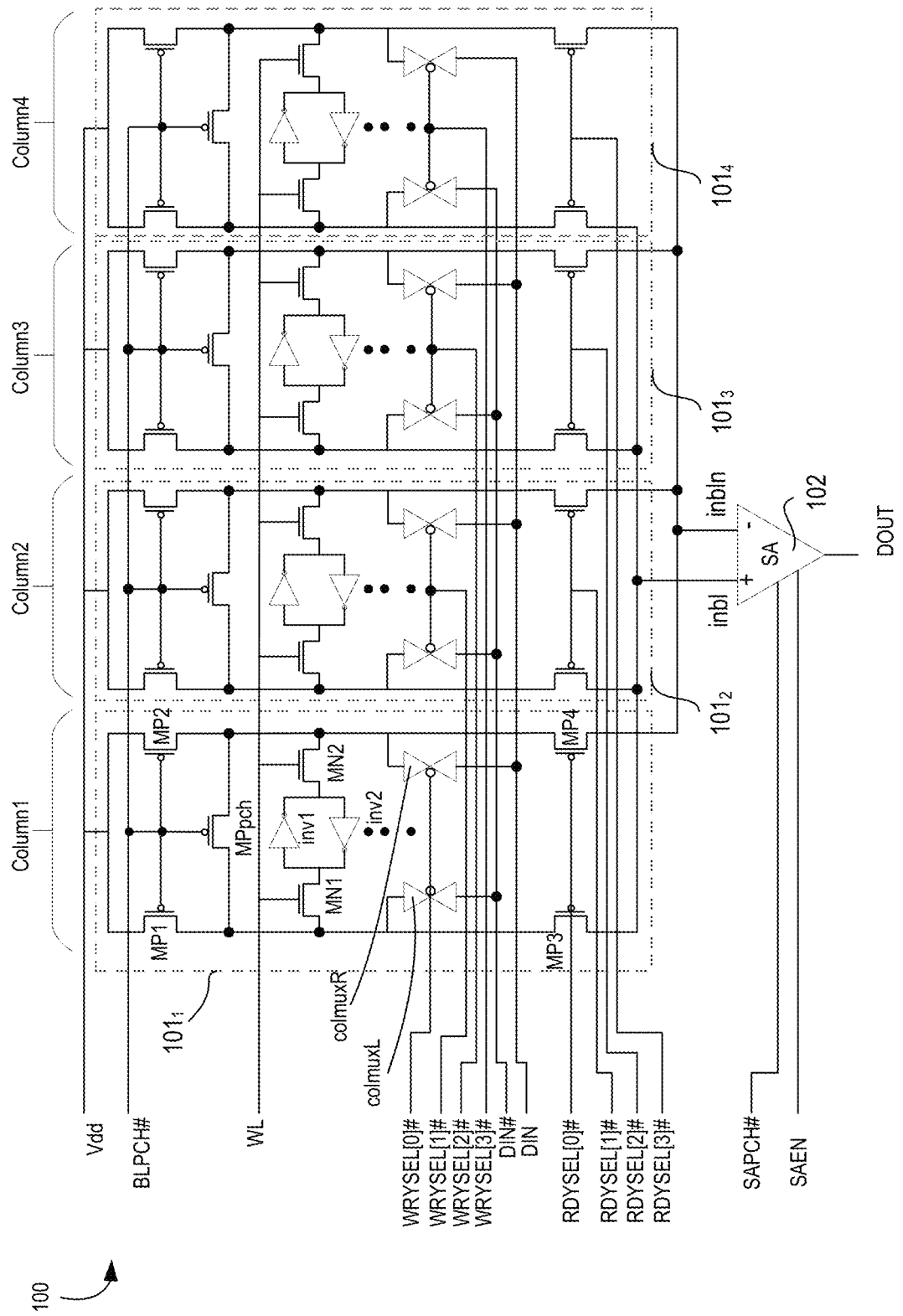
FIG. 1 illustrates a 4-bit slice of a baseline SRAM array.

If a memory access pattern is known, then the memory (e.g., SRAM) can be optimized for lower power. An example of a known memory access pattern is accessing consecutive matrix elements from memory. Various embodiments describe a 6T SRAM architecture, which leverages prior knowledge of access pattern and improves energy dissipation for general matrix operations. The architecture improves memory access energy for a multitude of applications such as image processing, deep neural networks, and scientific computing workloads, for example. In some embodiments, prior knowledge of access pattern allows for burst read and/or write operations. As such, burst mode solution can provide energy savings in both READ (RD) and WRITE (WR) operations. Here, the term "burst" generally refers to reading or writing multiple bit-cells with one a single bit-line pre-charge and/or one word-line pulse.

Density advantages of 6T-SRAM make them ideal on-die memory for storing large matrices. SRAM generally employs column multiplexing (muxing) for improving area by amortizing sense amplifier and/or write driver overhead across multiple columns, and thereby improving resiliency against multi-bit soft-error upsets. Although a single bit from a given column is read out or written at a given clock cycle (or word-line cycle), all columns are pre-charged and adjacent bits on the same word-line, but from unselected columns undergo pseudo-reads; wasting energy. Some embodiments exploit the fact that the non-selected bit-lines are already pre-charged and read them out in a series of back-to-back reads with one word-line (WL) firing in a given read access. A similar scheme is followed for a write operation, where one pre-charge operation is enabled for multiple (e.g., four) consecutive write operations. This aligns with a typical matrix access pattern where elements are accessed following a linearly increasing addressing scheme. Various embodiments may not alter the design of the 6T bit-cell, the periphery (IO) circuits, and to most of the critical read (RD) and/or write (WR) signals.

There are many technical effects of various embodiments. For example, performance of workloads, involving matrix operations such as deep-neural network training and inference that are typically limited by on-chip and off-chip memory bandwidth, is improved. Various embodiments use a technique to improve memory energy dissipation by up to, for example, 37% (for 4-to-1 column multiplexing case) by reading out successive columns (without having to wait for next read access) and minimum of, for example, 30% savings (for 4-to-1 column multiplexing case) by writing successive columns. The energy improvement increases with the degree of column multiplexing (e.g., number of memory bit-cells sharing sense-amplifier and write-driver). Other technical effects will be evident from the various figures and embodiments.

Memory read contributes significant dynamic capacitance (Cdyn) to matrix-vector multiplication kernel that is crucial to evaluating various DNN topologies such as fully-connected or recurrent-neural networks. Various embodiments reduce SRAM Cdyn by preventing read of bits whose location and value is known ahead of time. The embodiments of various embodiments also eliminates switching energy of data-bus driven by the memory by not toggling them. Some embodiment use the unused metadata bits for disabling read from sections of the memory subarray.

Metadata information (such as in run-length encoding) that is stored along with compressed data, is typically smaller in size compared to the data that is stored in the compressed format. For a 64B cache line storing compressed 1B weights, cache line storing metadata occupies 32B space. Since the weight values are known ahead in time (e.g., inference operation), the unused 32B in the cache line are exploited to store a sparsity map that is used for disabling read from either upper or lower half of the cache line, thus saving Cdyn.

Various embodiments reduce SRAM cdyn while reading the pre-stored weights. This saves power for matrix-vector multiplication kernel, where the weights are in the matrix format, and the activations are in a vector format. Matrix-vector multiplication is a key kernel in most inference accelerators. Various embodiments improve the energy for such accelerator in a data-center setting. Other technical effects will be evident from the various figures and embodiments.

While the embodiments are described with reference to 6T SRAM cells, the embodiments are not limited to just that configuration of SRAMs or that type of memory. For example, the embodiments are applicable to 4T SRAM, 8T-SRAM, and other memory types such as ferroelectric memories, phase change memories, resistive RAM, magnetic RAM, flash memory, etc. Various embodiments are also applicable to memories with column multiplexing.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a 4-bit slice 100 of a baseline SRAM array. The slice design of the baseline SRAM array has 4-way column multiplexing, (e.g., four columns share the same input/output (JO)). Here, the four columns within one slice are $101_1$, $101_2$, $101_3$, and $101_4$, which are coupled to a shared sense amplifier (SA) 102. Each column (e.g., $101_1$) includes pre-charge p-type transistors MP1, MP2, and n-type transistor MN3; bit-cell comprising access n-type transistors MN1 and MN2, and cross-coupled inverters inv1 and inv2; write column selectors (e.g., transmission gates) colmuxL and colmuxR, and read column selectors (e.g., p-type transistors MP3 and MP4). The access transistors are coupled to bit-line (BL) and inverse of bit-line (BL #). Here, BL is coupled to transistors MP1, MN1, MPpch, MP3, and left column multiplexer (colmuxL), while BL # is coupled to transistors MP2, MN2, MPpch, MP4, right column multiplexer (colmuxR). In this example, there are 255 more bit-cells sharing BL and BL # which are not shown here for brevity (indicated three dots). Hence, BL will have connection to more transistors and same is the case for BL #.

Word-line (WL) is coupled to the gate of the access transistors MN1 and MN2, and is shared across all columns within the slice. Bit-line pre-charge (BLPCH) is also shared across all columns in the slices. SRAM array comprises of multiple such slices and all slices operate in parallel with independent BL/BL #, column multiplexers for read and write operations, SA, BLPCH, and write drivers. Here, the symbol '#' at the end of the signal name indicates a complementary signal. For example, BL # is a complementary or inverse of BL. The column multiplexers (colmuxL and colmuxR) of each bit-cell is controlled by a particular write column select signal. For example, column multiplexers (colmuxL and colmuxR) of column $101_1$ is controlled by WRYSEL[0]#; column multiplexers (colmuxL and colmuxR) of column $101_2$ is controlled by WRYSEL[1]#; column multiplexers (colmuxL and colmuxR) of column $101_3$ is controlled by WRYSEL[2]#; column multiplexers (colmuxL and colmuxR) of column $101_4$ is controlled by WRYSEL[3]#. The read select transistors MP3 and MP4 for each bit slice is controlled by a particular read select signal. For example, read select transistors MP3 and MP4 for column $101_1$ is controlled by RDYSEL[0]#; read select transistors MP3 and MP4 for column $101_2$ is controlled by RDYSEL[1]#; read select transistors MP3 and MP4 for column $101_3$ is controlled by RDYSEL[2]#; and read select transistors MP3 and MP4 for column $101_4$ is controlled by RDYSEL[3]#.

The read select transistors and write column select multiplexers eventually output two bit-lines inbl and inbln (e.g., BL and BL #) which are input to sense amplifier 102. The output of the sense amplifier 102 is DOUT. Sense amplifier 102 can be disabled during write operation via enable signal SAEN, and enabled during read operation. The internal nodes for sense amplifier 102 can be pre-charged by SAPCH # for faster and low power sensing of inbl and inbln.

Since the lower two address bits are used to select one of the four columns, the scheme of various embodiments ensures that four consecutive elements of the matrix are stored in consecutive columns. For the baseline design, each read (and write) can either take one cycle (e.g., for throughput sensitive applications running at less than approximately 2 GHz clock speeds) or two cycles (e.g., for latency sensitive applications running at greater than approximately 2 GHz clock speeds). While various technical effects are illustrated with the 4-bit slice, any number of bit-slices can be used. Generally, as more columns that share the same I/O (and sense amplifier and write drivers) are used, more power savings can be materialized by burst read and write operations.

In one example, each slice includes 256×4 bits from which you read one bit. Here, 256 refers to 256b sharing same bit-line (along column) and bit-line # and 4 refers to bit-cells sharing same word-line pulse (along row) and PCH is shared by an entire 256×4 array. Hence in a slice BLPCH is shared by 256×4 bits WL is shared by 4 bits, and there are N such slices in sub-array. N is typically 64. Hence, from one-subarray 64b are accessed in one-cycle and burst up to 4 is enabled since '4' is sharing the same BLPCH and word-line. Out of 256b shared along the column direction, merely one is read since merely that word-line is turned ON. The remaining 255 word-lines are OFF, in that case. The number of pre-charge pulse is same as the number of read operations. N slices operate in parallel in one cycle. As such, there are M read operations consecutively giving a total of N×M bits or for example 64b×4=256b. Hence, in one slice (N=1), there are 4 pre-charge pulses to read 4 bits in consecutively cycles (in baseline). In burst mode that 4 pre-charge pulses become one pre-charge pulse.

In various embodiments, each slice of memory has 'M' bits sharing a same WL and 256 bits sharing same BL/BL #. Continuing with this embodiment, each slice has M pairs of BL/BL # out of which 1 will be selected per cycle. Here, M is a number of columns within a slice. From each slice, 1b per cycle read/write operations can be made or 1b per 2-cycles depending on the frequency of operation. If the same slice is read for 'M' times (M=4 for burst) then M bits are achieved over 4 cycles. Since there are N slices per sub-array, in each cycle, 'N' bits can be read and over 4 cycles, and so 4×N bits are read.

Figure 2:
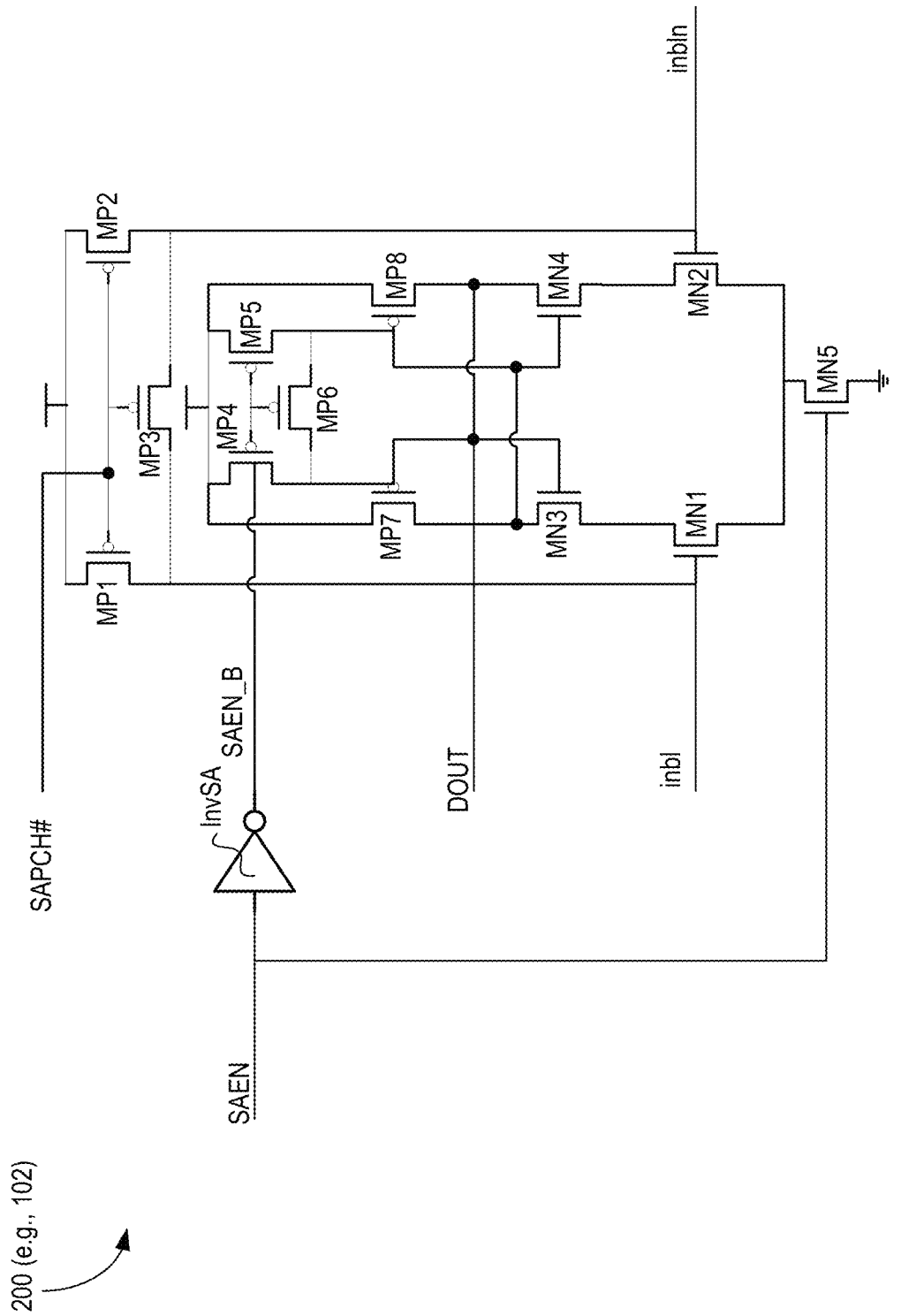
FIG. 2 illustrates a sense amplifier of the baseline SRAM array.

FIG. 2 illustrates a sense amplifier (SA) 200 (e.g., 102) of the baseline SRAM array. SA 200 comprises p-type transistors MP1, MP2, MP3, MP4, MP5, MP6, MP7, and MP8; inverter InvSA, n-type transistors MN1, MN2, MN3, MN4, and MN5 coupled as shown.

Figure 3:
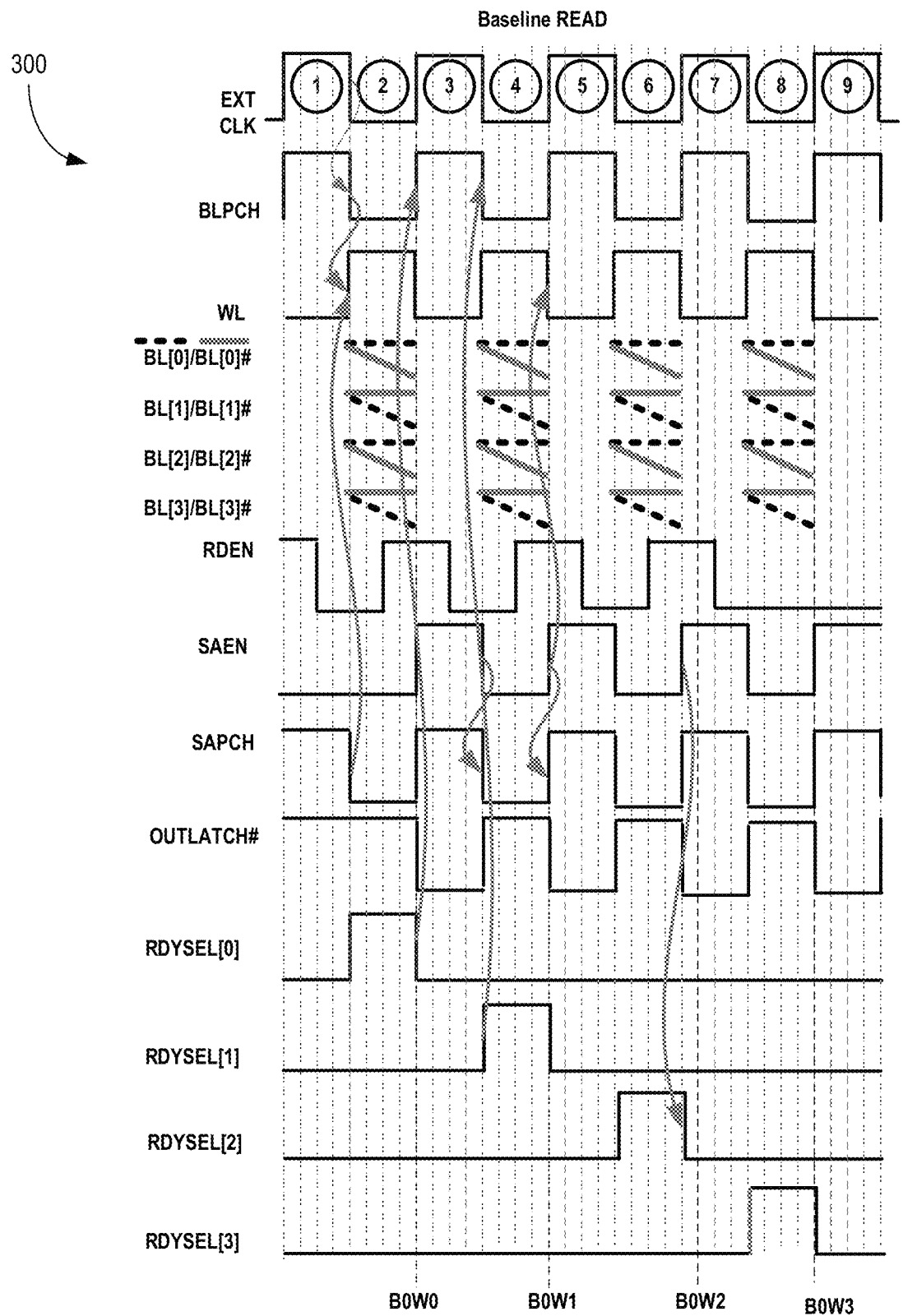
FIG. 3 illustrates a timing diagram showing baseline read access that completes four read operations in four cycles.

FIG. 3 illustrates timing diagram 300 showing baseline read access that completes four read operations in four cycles. Timing Diagram 300 shows the baseline 1-cycle read scheme, where for reading four consecutive bits, there are a total of four BL pre-charge (BLPCH) operations and four WL pulses. Here, the dashed line represents the BL voltage and the solid gray line indicates the BL # voltage. As voltage between BL and BL # separates after pre-charge, SA 200 (102) senses the difference when SAEN is high (i.e., SA 102 is enabled).

Figure 4:
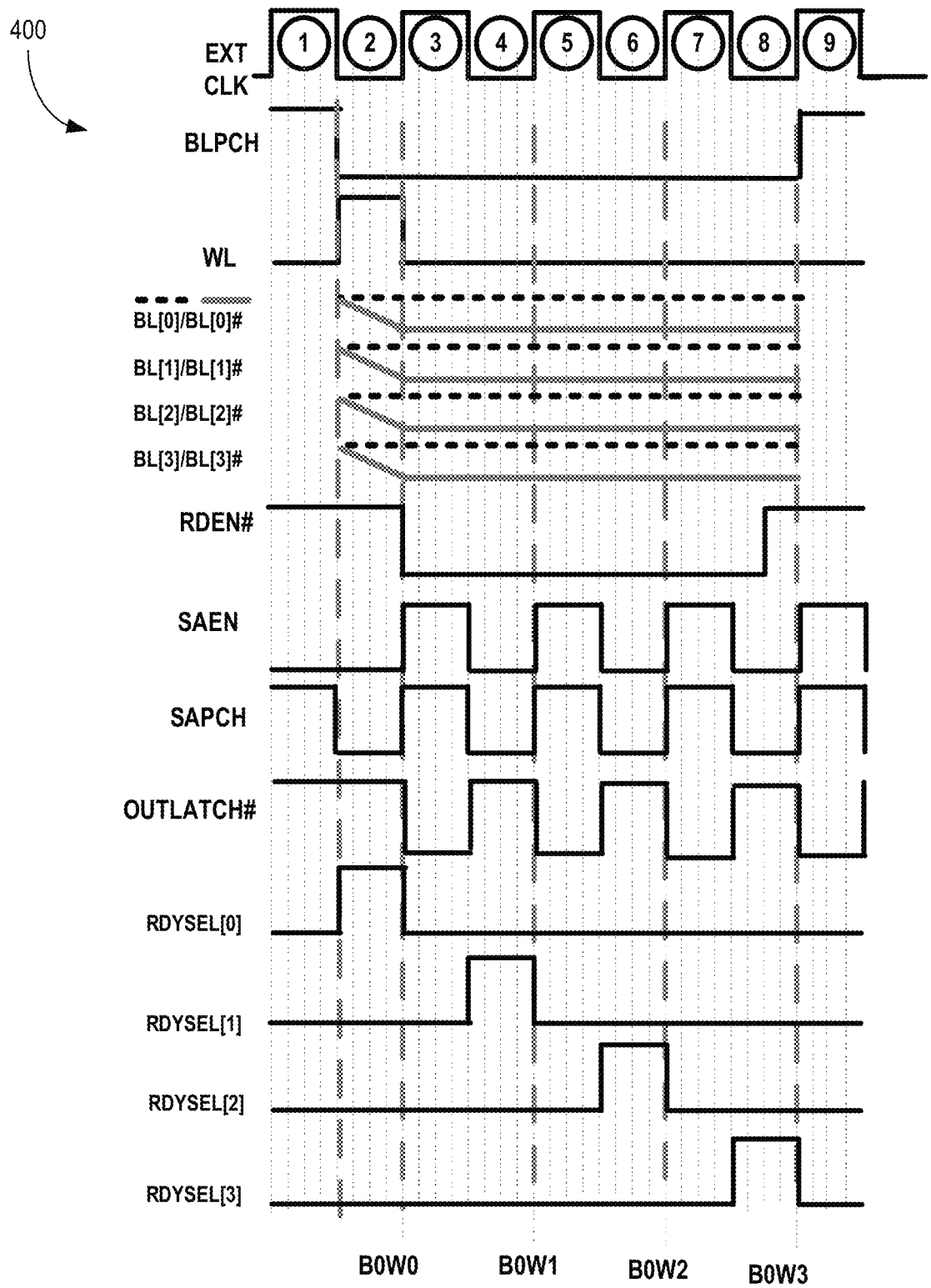
FIG. 4 illustrates a timing diagram showing 4-cycle burst read scheme that completes four read operations in four cycles, in accordance with some embodiments.

FIG. 4 illustrates timing diagram 400 showing 4-cycle burst read scheme that completes four read operations in four cycles, in accordance with some embodiments. Timing diagram 400 shows the modified read scheme in accordance with some embodiments. This scheme saves energy compared to the scheme of FIG. 3 by removing repeated unnecessary BL pre-charging and WL pulses for consecutively accessed bits on the same active WL.

In each sub-array there are N slices (N=64 for example) and all N slices operate in parallel to provide 64b/cycle from one sub-array. In each slice there are 'M' bits sharing same PCH (pre-charge) logic and same WL (M=4 for example). In burst read mode, burst last for 'M' cycles with one PCH signal and one WL signal instead of 4 PCH and 4 WL pulses (word-line) which is the case in baseline mode of FIG. 3. In burst write mode, burst last for 'M' cycles with one PCH signal and one WL (or 4WL depending on the scheme) signal instead of 4 PCH and 4 WL (word-line) signals which is the case in baseline mode. Burst mode is enabled in all N slices since they are operating in parallel for one sub-array.

In some embodiments, there is merely one BLPCH operation and one WL pulse, proportionally reducing the read operation energy associated with pre-charging, as well as WL and BLPCH signals generation. As shown in timing diagram 400, the WL is high for one phase, allowing the slowest bit-cell to generate the same worst-case (minimum) BL differential needed to overcome sense-amplifier offset for a correct read operation. If there are concerns of the BL differentials vanishing between WL turning OFF (being de-asserted) and RDYSELs turning ON (being asserted), particularly for the last read column during very slow frequency testing for example, the WL can be kept ON for a longer period of time, in accordance with some embodiments. This may impact the energy savings since the differential may increase and needs to be compensated back during the BL pre-charge phase.

In baseline case of FIG. 3, due to pseudo read operation, 4 BL/BL # differential is generated for one read operation resulting in a total 16 BL/BL # differential for 4 read operations. In the modified scheme (burst scheme) of FIG. 4, merely 4 BL/BL # differential are generated for all 4 read operations. Hence, eliminating pseudo-reads results in approximately 4× improvement in BL/BL # pre-charge energy in the modified scheme (burst scheme) of various embodiments.

Figure 5:
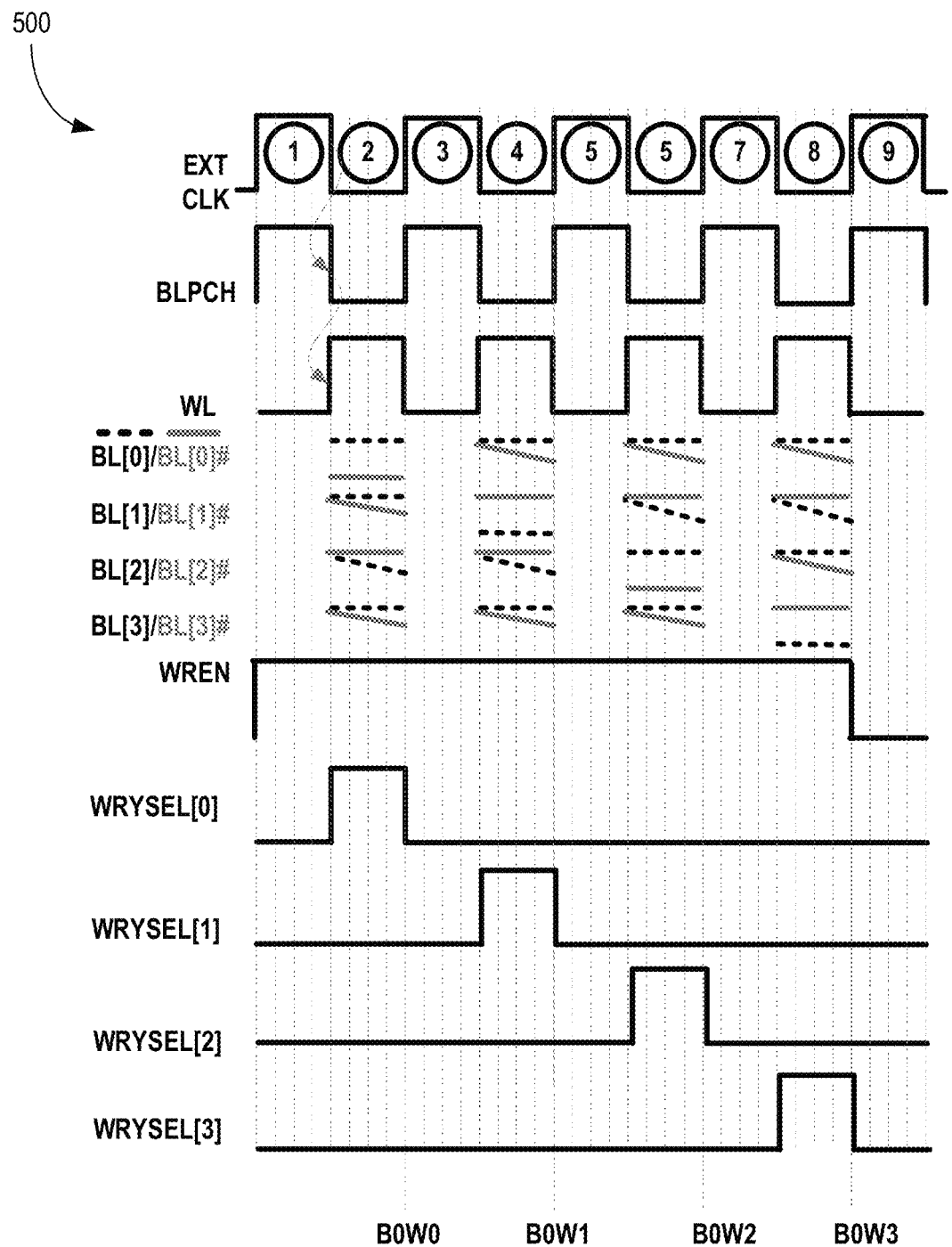
FIG. 5 illustrates a timing diagram that shows baseline write access that completes four write operations in four cycles.

FIG. 5 illustrates timing diagram 500 that shows baseline write access that completes four write operations in four cycles. In this case, the pattern written to the 4-bit cells is 1010. Before, each write operation, BL is pre-charged. Here, four 1-bit writes are performed in four cycles of external clock (EXT CLK).

Figure 6A:
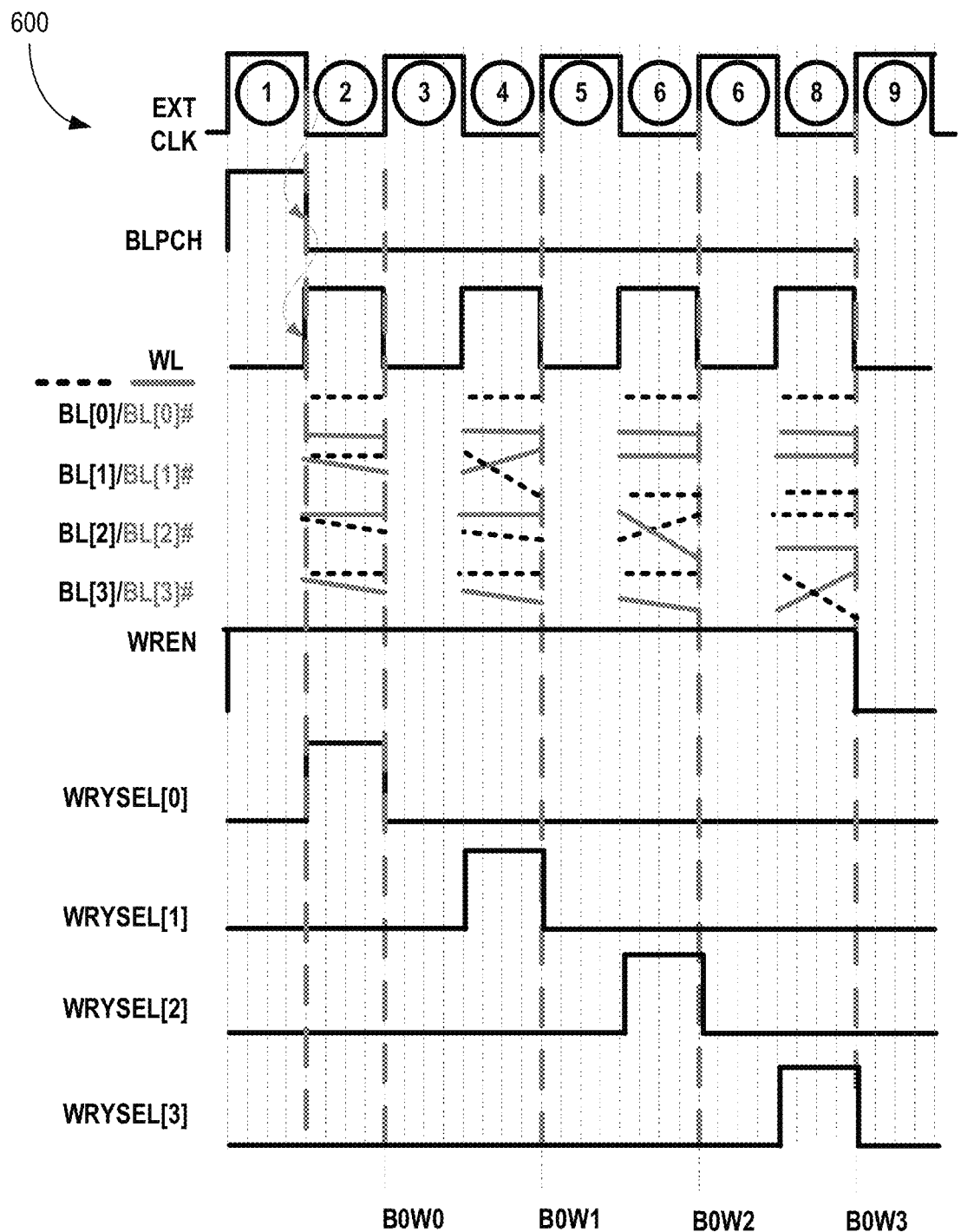
FIG. 6A illustrates a timing diagram that shows 4-cycle burst write scheme that completes 4 writes in four cycles without equalization, in accordance with some embodiments.

FIG. 6A illustrates timing diagram 600 that shows 4-cycle burst write scheme that completes four writes in four cycles without equalization, in accordance with some embodiments. Similar to burst read, one BL/BL # pre-charge operation is used to perform back-to-back writes on adjacent bits. In various embodiments, all columns are written, and it may be possible to eliminate WL under-drive (WLUD) read assist, and even apply WL boosting to improve write Vmin. This also helps eliminate transient voltage collapse (TVC) write assist, which is a major source of high dynamic power and peak current in our arrays.

In some cases, during write operation, one BL of each BL pair will progressively discharge due to pseudo read as shown in FIG. 6A. Under worst-case scenario, where the BL discharges in the opposite direction to the data to be written, that "lost" charge is compensated by the write driver for correct write operation, reducing the potential energy savings as a result. Despite that, a minimum (maximum) of, for example, 30% (38%) write energy savings is achieved as shown in Table 1, which gives energy savings for the multi-read and multi-write operations of various embodiments as compared to baseline at two voltage and frequency points.

TABLE 1

| | Baseline | Burst SRAM | Percentage Saving |
|---|---|---|---|
| Vdd = 0.65 V, EXT CLK 1 GHz, Temperature 100 C., Typical process corner | | | |
| RD Energy (pJ/b) | 0.045 | 0.029 | 36% |
| WR Energy (pJ/b) | 0.053 | 0.037 | 30% (worst-case) |
| WR Energy (pJ/b) | 0.053 | 0.033 | 38% (best-case) |
| Vdd = 0.76 V, EXT CLK 2 GHz, Temperature 100 C., Typical process corner | | | |
| RD Energy (pJ/b) | 0.052 | 0.035 | 35% |
| WR Energy (pJ/b) | 0.064 | 0.042 | 33% (worst-case) |

Figure 6B:
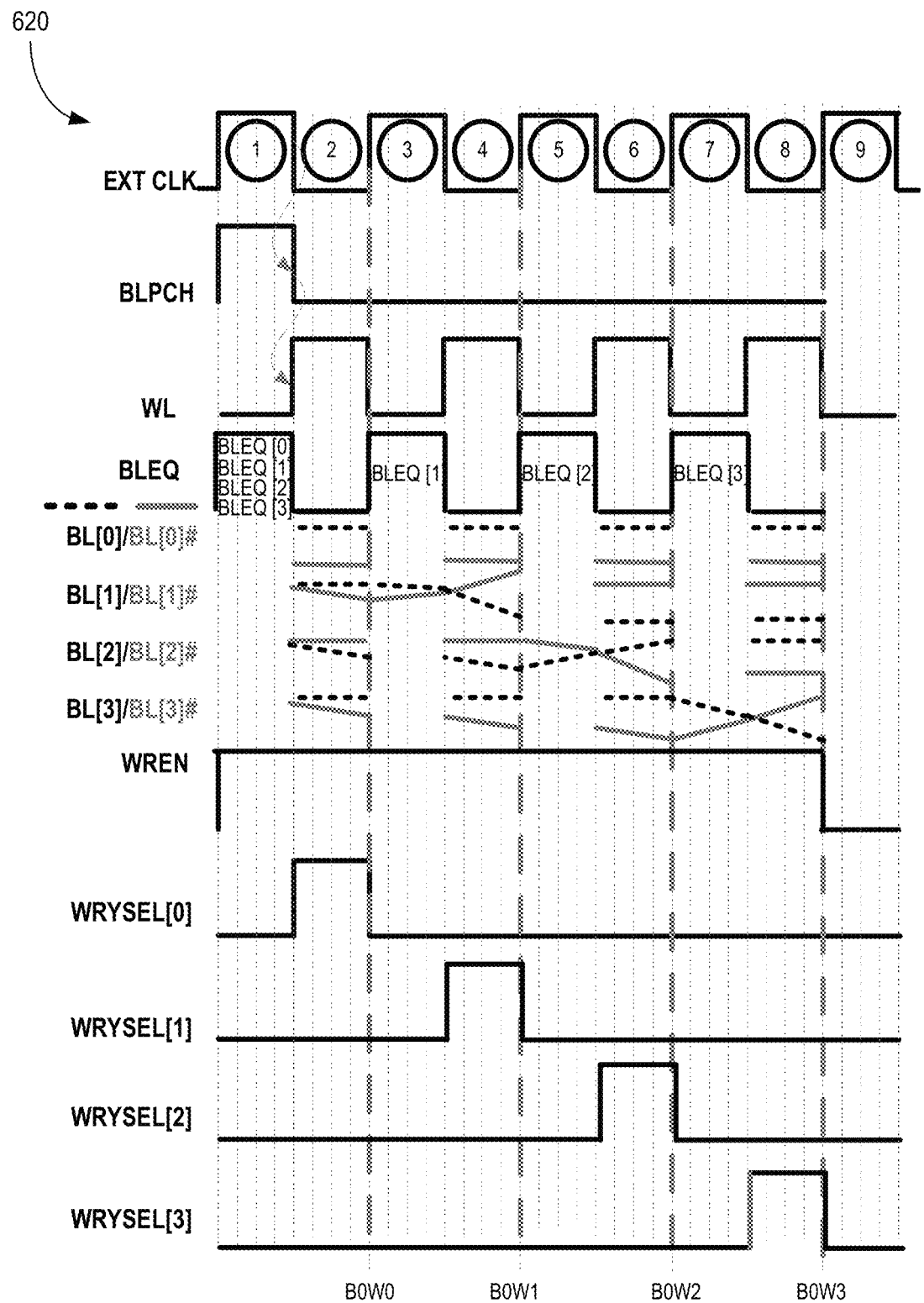
FIG. 6B illustrates a timing diagram that shows 4-cycle burst write scheme that completes 4 writes in four cycles with equalization, in accordance with some embodiments.

FIG. 6B illustrates timing diagram 620 that shows 4-cycle burst write scheme that completes four writes in four cycles with equalization, in accordance with some embodiments. In some embodiments, BL and BL # are equalized. In this case, BL/BL # [3:0] are equalized using BLEQ [3:0] signals which are turned on just before the corresponding WL pulse is asserted for writing consecutives bits B0W0, B0W1, B0W2, and B0W3. Equalization improves writability by destabilizing the bit-cell on the onset of the write-operation. Equalization eliminates TVC write assist (transient cell supply voltage collapse write assist) which is a major source of high dynamic power and peak current.

Figure 6C:
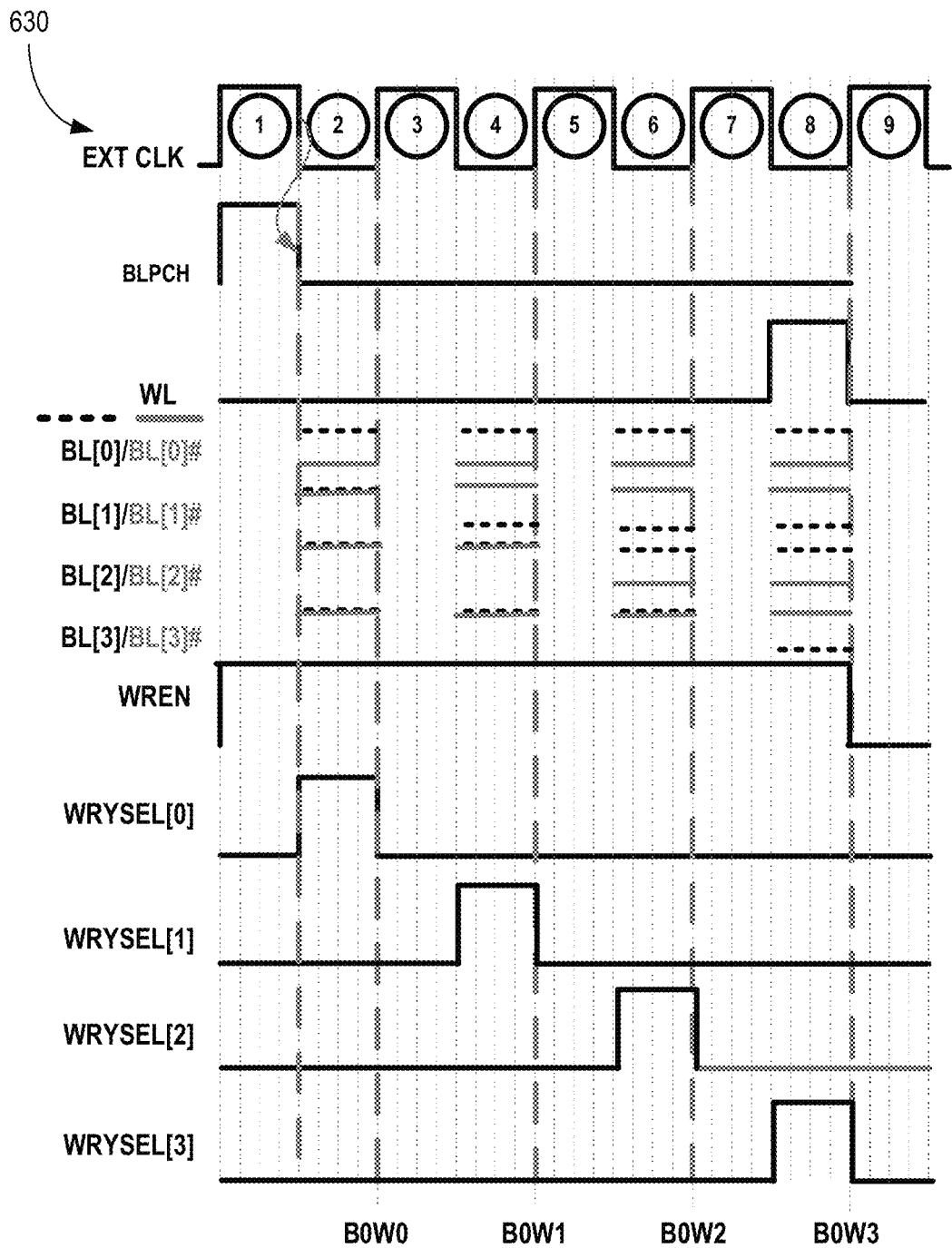
FIG. 6C illustrates a timing diagram that shows 4-cycle burst write scheme that with one WL pulse only, in accordance with some embodiments.

FIG. 6C illustrates timing diagram 630 that shows 4-cycle burst write scheme that with one WL pulse, in accordance with some embodiments. Timing diagram 630 shows another variant where the bit-lines are consecutively written and then a single WL pulse is used at the end to write all bits at once in order to save WL toggle energy. Unlike a baseline write operation, where the write driver continues to drive the bit-lines when the WL is turned on, the scheme of various embodiments floats BL/BL # [2:0]. Since BL capacitance is typically much larger than bit-cell capacitance, correct write operation is still feasible with this scheme—particularly since WLUD (word line under drive) is eliminated and the WL is boosted.

Figure 7:
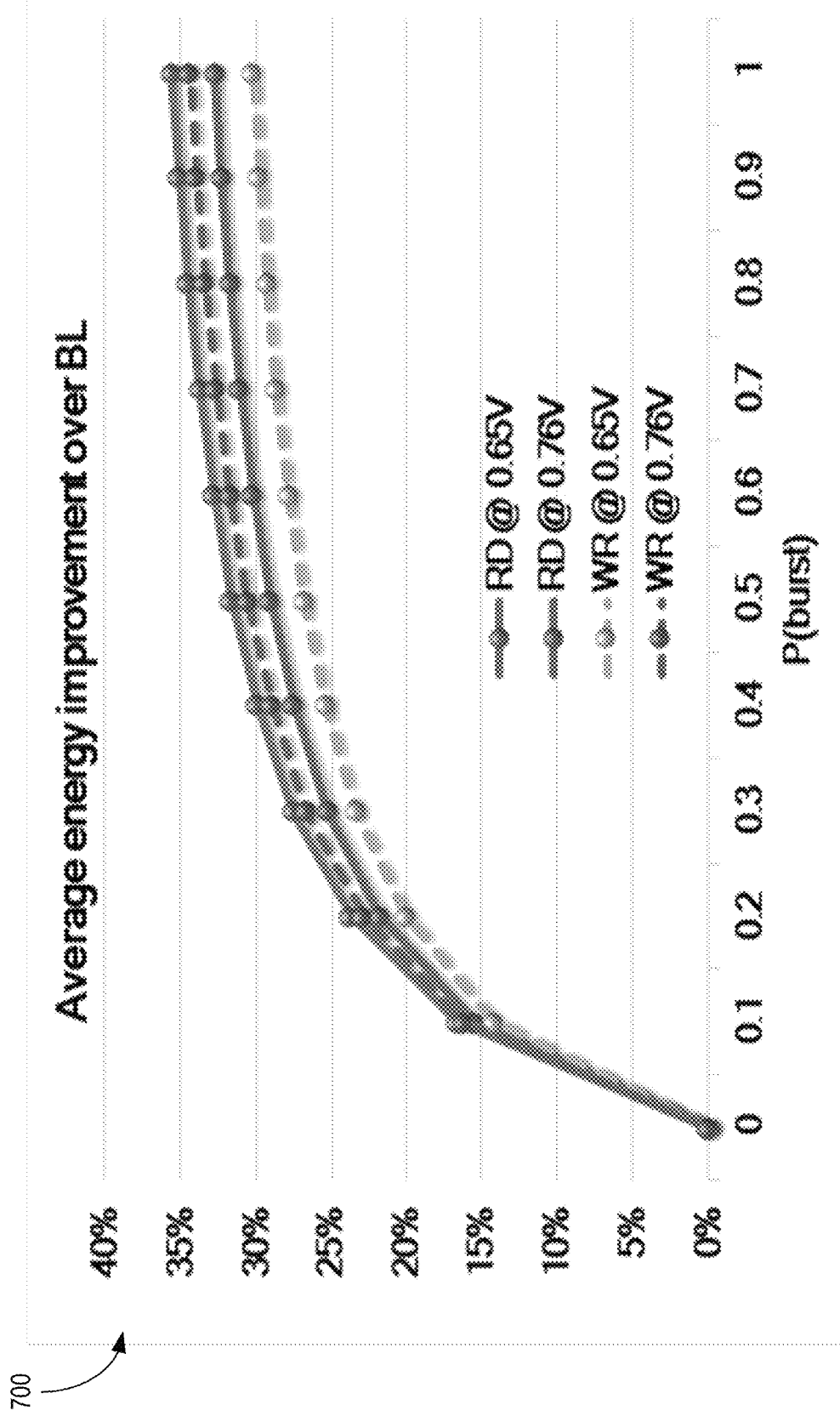
FIG. 7 illustrates a plot that shows read and write energy improvement as a function of probability of burst, in accordance with some embodiments.

FIG. 7 illustrates plot 700 that shows read and write energy improvement as a function of probability of burst (P(burst)), in accordance with some embodiments. P(burst) is the probability of an agent requesting a burst operation. Read (worst-case write) improvement reaches a maximum of 36% (30%), in this example, with P(burst)=1. Note, that applications which do not have significantly high P(burst) can also benefit from the scheme of various embodiments as energy savings start immediately for P(burst)>0.

Figure 8:
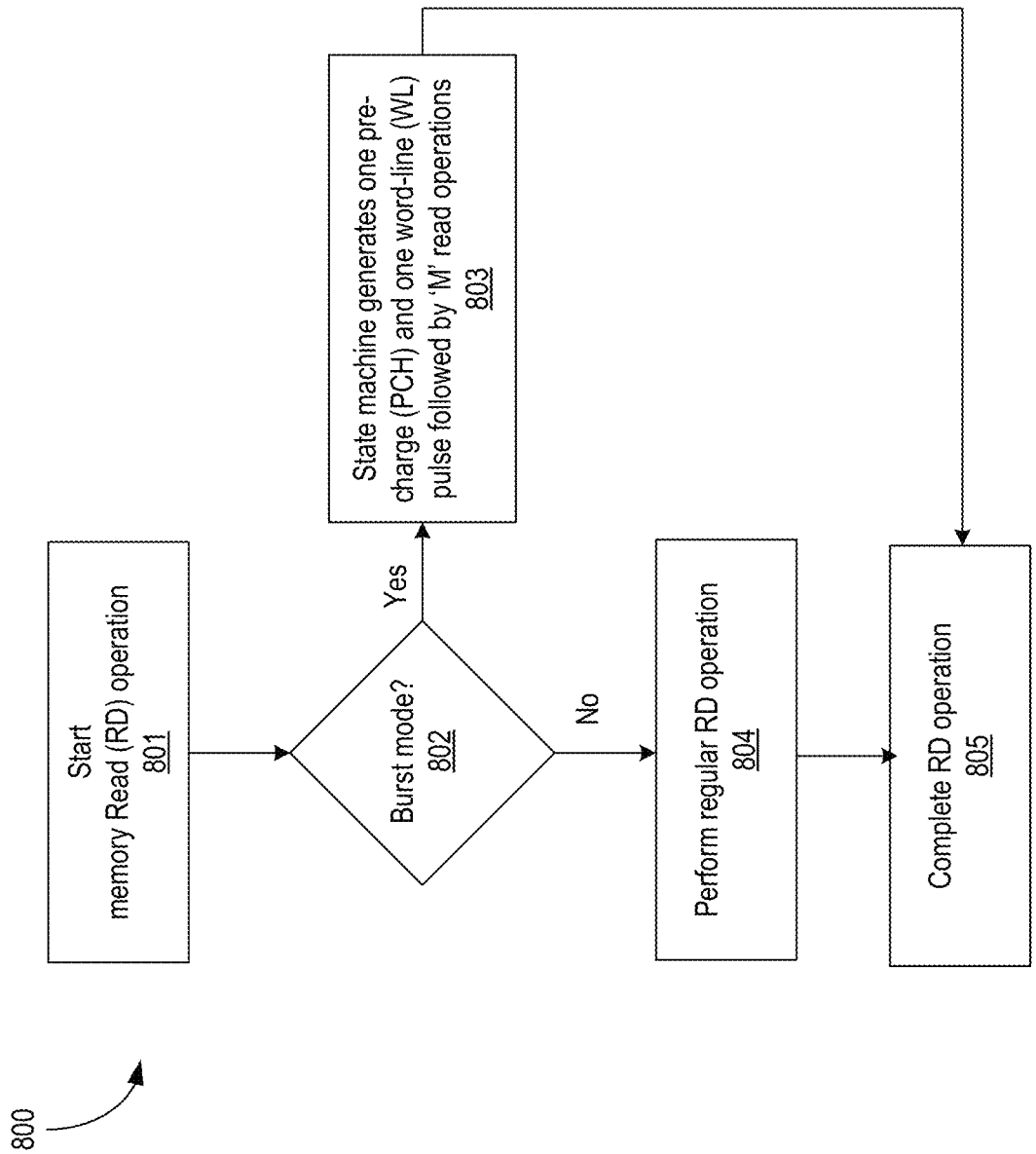
FIG. 8 illustrates a flowchart of a method for burst read operation, in accordance with some embodiments.

FIG. 8 illustrates flowchart 800 of a method for burst read operation, in accordance with some embodiments. Various blocks in flowchart 800 are shown in a particular order. However, the order can be modified. For example, some blocks can be performed before other, and some blocks can be performed in parallel or simultaneously.

At block 801, memory read operation begins. At block 802, a determination is made by memory controller logic whether burst mode is enabled. If burst mode is enabled, then at block 803 the memory controller logic or any suitable finite state machine (FSM) generates one pre-charge for all bit-slices in a section (e.g., 4 slices in one section) and one WL pulse followed by M read operations, where M is an integer (e.g., M=4 with reference to various timing diagrams shown). Once all bit-cells in each bit-slice are read together, the process proceeds to block 805 and read (RD) operation is deemed complete. Here, complete implies that SA 102 reads each bit-cell value one at time within one pre-charge. If burst mode is not enabled, then the memory controller logic or any suitable FSM proceeds to block 804 where regular read operation is performed. In regular read operation, each WL is asserted after each BL pre-charge per bit-cell to read data from that bit-cell. The process then proceeds to block 805 where SA 102 reads each column one at a time.

Flowchart 800 can be performed by hardware, software, or a combination of both. For example, the flowchart can be performed by memory controller logic or particular finite state machine implemented in hardware.

Figure 9:
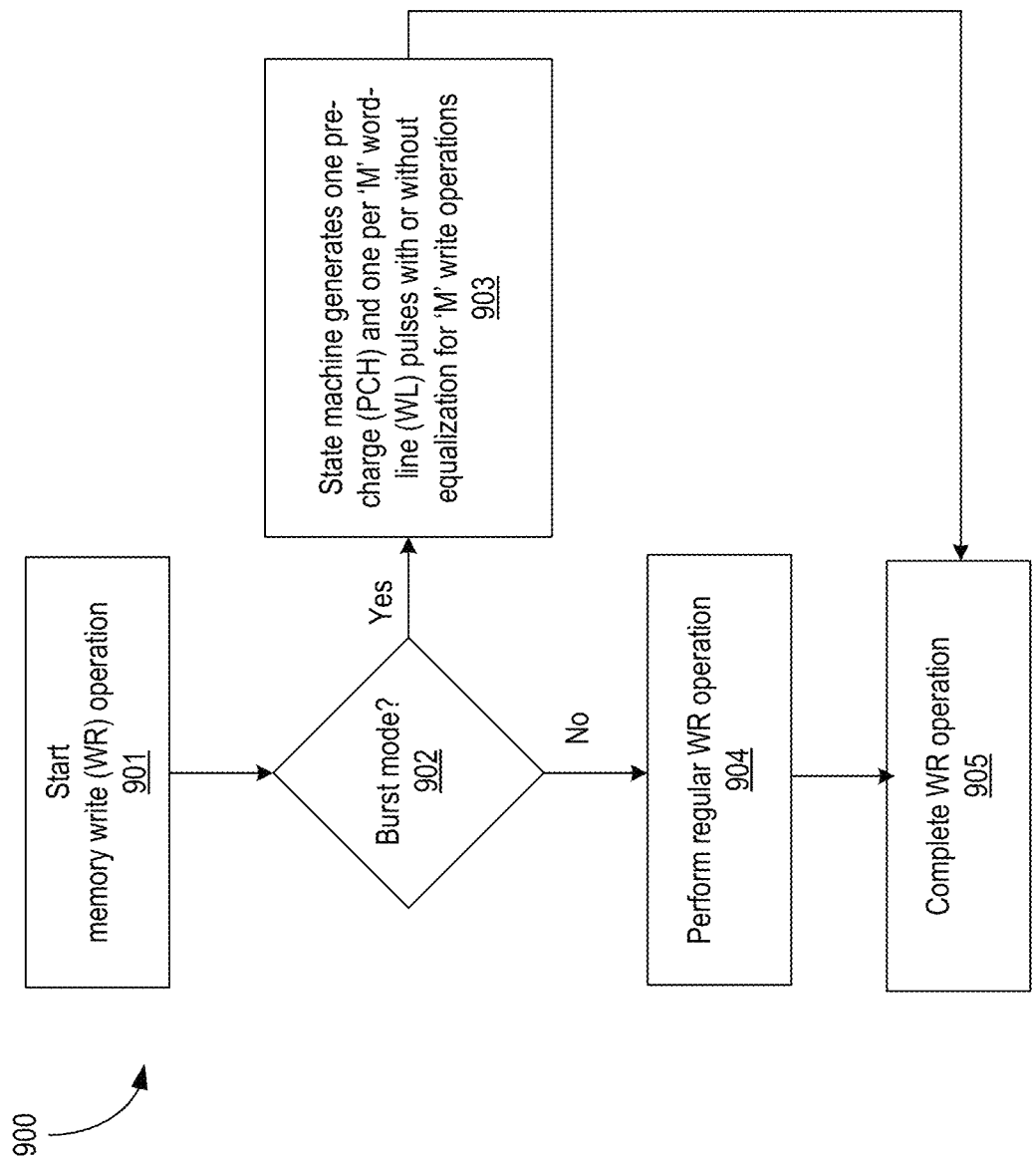
FIG. 9 illustrates a flowchart of a method for burst write operation, in accordance with some embodiments.

FIG. 9 illustrates flowchart 900 of a method for burst write operation, in accordance with some embodiments. Various blocks in flowchart 900 are shown in a particular order. However, the order can be modified. For example, some blocks can be performed before other, and some blocks can be performed in parallel or simultaneously.

At block 901, memory read operation begins. At block 902, a determination is made by memory controller logic whether burst mode is enabled. If burst mode is enabled, then at block 903 he memory controller logic or any suitable FSM generates one pre-charge for all bit-slices in a section (e.g., 4 slices in one section) for M write operations. In some embodiments, before writing at block 903, it is determined whether equalization is enabled.

In equalization, BL/BL # (e.g., BL/BL # [3:0]) are equalized using BLEQ [3:0] signals which are turned on just before the corresponding WL pulse is asserted for writing consecutives bits B0W0, B0W1, B0W2, and B0W3. Equalization help can help improve writability by destabilizing the bitcell on the onset of the write-operation. This can also help to eliminate TVC write assist, which is a major source of high dynamic power and peak current.

In some embodiments, each bit-cell in the slice is written during one WL cycle. In some embodiments, a single WL pulse is used at the end to write all bits at once to save WL toggle energy. Unlike a baseline write operation, where the write driver continues to drive the bit-lines when the WL is turned on, the burst write of various embodiments floats BL/BL # [2:0]. The process then proceeds to block 905 where burst write operation is deemed complete. If burst mode is not enabled, then regular write (WR) operation is performed at block 904. The process them proceeds to block 905 where WR operation is deemed complete.

Flowchart 900 can be performed by hardware, software, or a combination of both. For example, the flowchart can be performed by memory controller logic or particular finite state machine implemented in hardware.

Elements of embodiments (e.g., flowcharts 800 and 900, and schemes described with reference to various figures) are also provided as a machine-readable medium (e.g., memory) for storing the computer-executable instructions (e.g., instructions to implement any other processes discussed herein). In some embodiments, computing platform comprises memory, processor, machine-readable storage media (also referred to as tangible machine-readable medium), communication interface (e.g., wireless or wired interface), and network bus coupled together as shown.

In some embodiments, processor is a Digital Signal Processor (DSP), an Application Specific Integrated Circuit (ASIC), a general purpose Central Processing Unit (CPU), or a low power logic implementing a simple finite state machine to perform the method of flowcharts 800/900 and/or various embodiments, etc.

In some embodiments, the various logic blocks are coupled via network bus. Any suitable protocol may be used to implement network bus. In some embodiments, machine-readable storage medium includes instructions (also referred to as the program software code/instructions) for calculating or measuring distance and relative orientation of a device with reference to another device as described with reference to various embodiments and flowchart.

Program software code/instructions associated with flowcharts 800/900 (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowcharts 800/900 (and/or various embodiments) are executed by the system.

In some embodiments, the program software code/instructions associated with flowcharts 800/900 (and/or various embodiments) are stored in a computer executable storage medium and executed by the processor. Here, computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer-to-peer networks and the like, including the Internet. Different portions of the software program code/instructions and data can be obtained at different times and in different communication sessions or in the same communication session.

The software program code/instructions (associated with flowcharts 800/900 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine-readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine-readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

In some embodiments, an apparatus (e.g., memory controller, finite state machine) comprises: a first logic to determine whether burst mode is enabled for reading and/or writing data from or to a memory. The memory includes a portion having N number of slices, where each slice includes M bit-cells coupled to bit-line (BL), inverse of bit-line (BL #), column write selectors, and read selectors; and M bit-cells from each slice is controllable by a same word-line. In various embodiments, the apparatus includes a second logic to generate one pre-charge pulse and one word-line pulse for the N number of slices to perform M number of read operations after it is determined that the burst mode is enabled, reading a total of N×M bits.

In some embodiments, the second logic is to generate M number of pre-charge pulses for the N number of slices to perform M number of read operations after it is determined that the burst mode is disabled reading a total number of N×M bits. In some embodiments, N is equal to 64, and M is equal to 4. In some embodiments, the apparatus comprises a third logic to determine whether equalization mode is enabled prior to writing data to the memory. In some embodiments, the apparatus comprises a fourth logic to equalize bit-lines prior to writing data to the memory if the equalization mode is enabled. In some embodiments, the apparatus comprises fifth logic to generate one pre-charge pulse and one word-line pulse, for M number of write operations, to the N number of slices. In some embodiments, the apparatus comprises sixth logic to generate one word-line pulse for the Nth slice to write to M bit-cells, thus writing a total N×M bits. For example, every slice can read or write '1' and by repeating that operation M times, a total of N×M bits can be read from or written to.

The logic in various embodiments can be lumped in a single logic or multiple logic. The logic can be implemented as hardware circuitries, software routines, firmware, operating system, and a combination of any of them.

Figure 10:
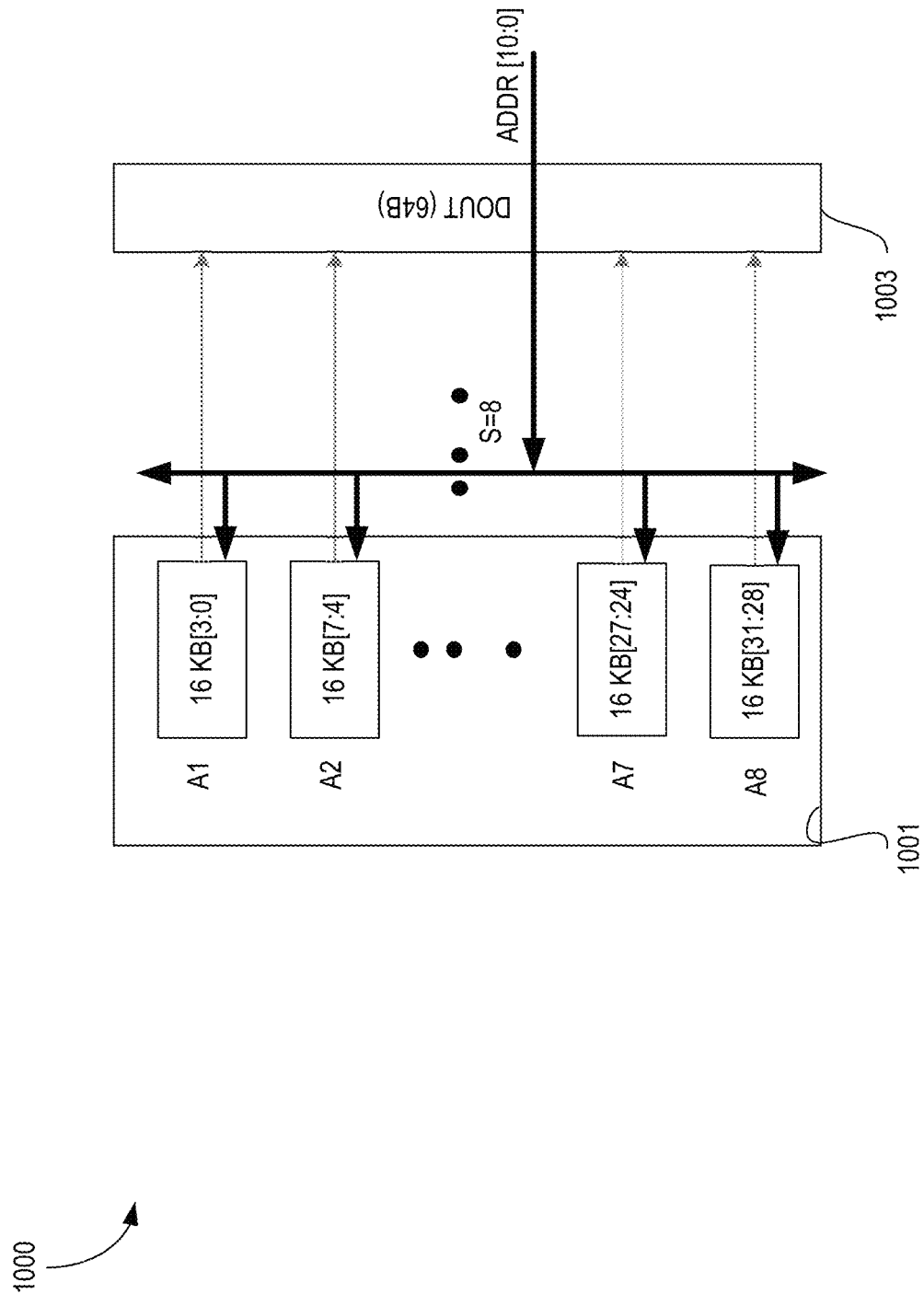
FIG. 10 illustrates a baseline architecture for memory read access with 64 B/cycle access.

FIG. 10 illustrates baseline architecture 1000 for memory read access with 64 B/cycle access. In a typical SOC application, more than one-subarray is activated to provide a desired memory bandwidth. In the example shown in FIG. 10, 8 sub-arrays are activated simultaneously to provide 64B/cycle (8B from each sub-array). However, this parallel access does not guarantee burst operation even though sub-array supports burst operation since same sub-array need to continuously read for 4 cycles to activate burst mode.

Architecture 1000 includes array 1001. Each array has four bits of 16 KB sub-arrays. Here eight sub-arrays are shown A1, A2, through A7 and A8. Architecture 1000 includes sense amplifier 1003 that generates 64 B of Dout. Here, address bus (e.g., 11 bits) is broad-casted from single point of origin. The 8 sub-arrays are accessed in parallel to provide 64b×8=512b/cycle, which is the same as 64B/cycle using an address bus of 11b. For burst to work, consecutive access from same sub-array are used which is not guaranteed in baseline architecture shown in FIG. 10. For example, next address can point any random address in the sub-array and may need not be consecutive as required by the burst access mechanism.

Figure 11:
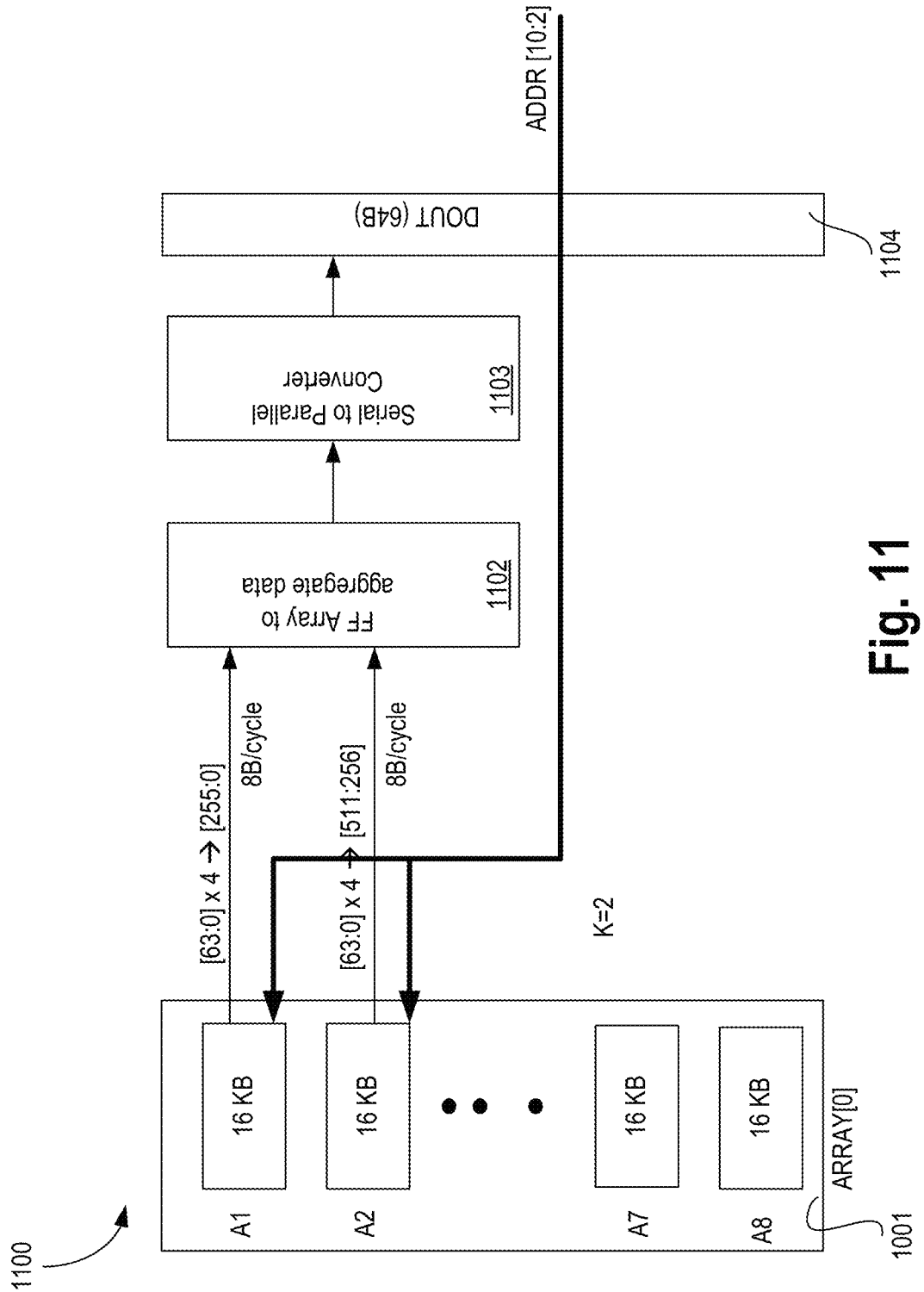
FIG. 11 illustrates a memory architecture with folded 64 B cache lines into two sub-arrays with each reading 16 B/cycle for 4 cycles, in accordance with some embodiments.

FIG. 11 illustrates memory architecture 1100 with folded 64 B cache lines into two sub-arrays with each reading 16 B/cycle for 4 cycles, in accordance with some embodiments. In this example, instead of 8 sub-arrays, merely two sub-arrays (K=2) are accessed. Further, the same sub-arrays are continuously accessed for 4 cycles for consecutive addresses thus guaranteeing burst access.

In the proposed architecture (of FIG. 11), instead of 8 sub-arrays, merely 2 sub-arrays are accessed in parallel and since data from rest of the 6 sub-arrays are mapped to 2 sub-arrays by folding with K=2, it is guaranteed that same sub-array will be accessed for 4 continuous cycles (e.g., 4×2×8B=64B) thus burst mode can be activated. As such, K=1 can be used, where one sub-array will be accessed continuously 8 cycles (8×1×8B=64B) thus also guaranteeing burst mode of 4+4. However, with K=4, 4 sub-arrays are accessed in parallel and in merely two cycles, and hence burst mode cannot be activated. One possible issue of FIG. 11 with K=2 is that latency increased from 1-cycle in baseline where 64B are accessed in 1-cycle to 4-cycles since sub-array need to be active for 4-cycles. With K=1, this latency increases to 8-cycles. Second, bandwidth per cycle also increases with K>1. To compensate for that, parallel access are allowed to inactive arrays by another agent requesting data.

In architecture 1100, a given cache line is mapped into fewer sub-arrays K, i.e., K<S. By folding the cache-line into K<S sub-arrays, burst-operation is enabled since a single sub-array needs to be accessed consecutively multiple times to read/write its portion of the N bytes. For the example shown in FIG. 11, and with K set to 2, two sub-arrays are both continuously accessed for 4 cycles. If a column multiplexing of 4 is used, then burst mode is enabled by mapping consecutive bytes to consecutive columns in a given sub-array such as each sub-array will read or write 4 cycles×8 bytes/cycle=32 bytes, for a total of N=2×32=64B bytes across the two subarrays. Here, address bus changes from [10:0] to [10:2] since in burst access two address bits [1:0] are implicit.

Memory architecture 1100 shows that folding a cache-line with M=2 results in an overhead of a flop bank 1202 and a serial-to-parallel de-multiplexer 1203 to aggregate the 64B cache line over 4 cycles, before sending it out via SA 1204. On the other hand, due to consecutive accesses of the same array for 4 continuous cycles, 2 LSBs (least significant bits) of the address can be removed. Note that cache line folding results in reducing the bandwidth from 64B/cycle to 16B/ cycle (with K=2 example). To compensate for the loss in bandwidth, 4 parallel read/write operations are enabled as shown in FIG. 12.

Figure 12:
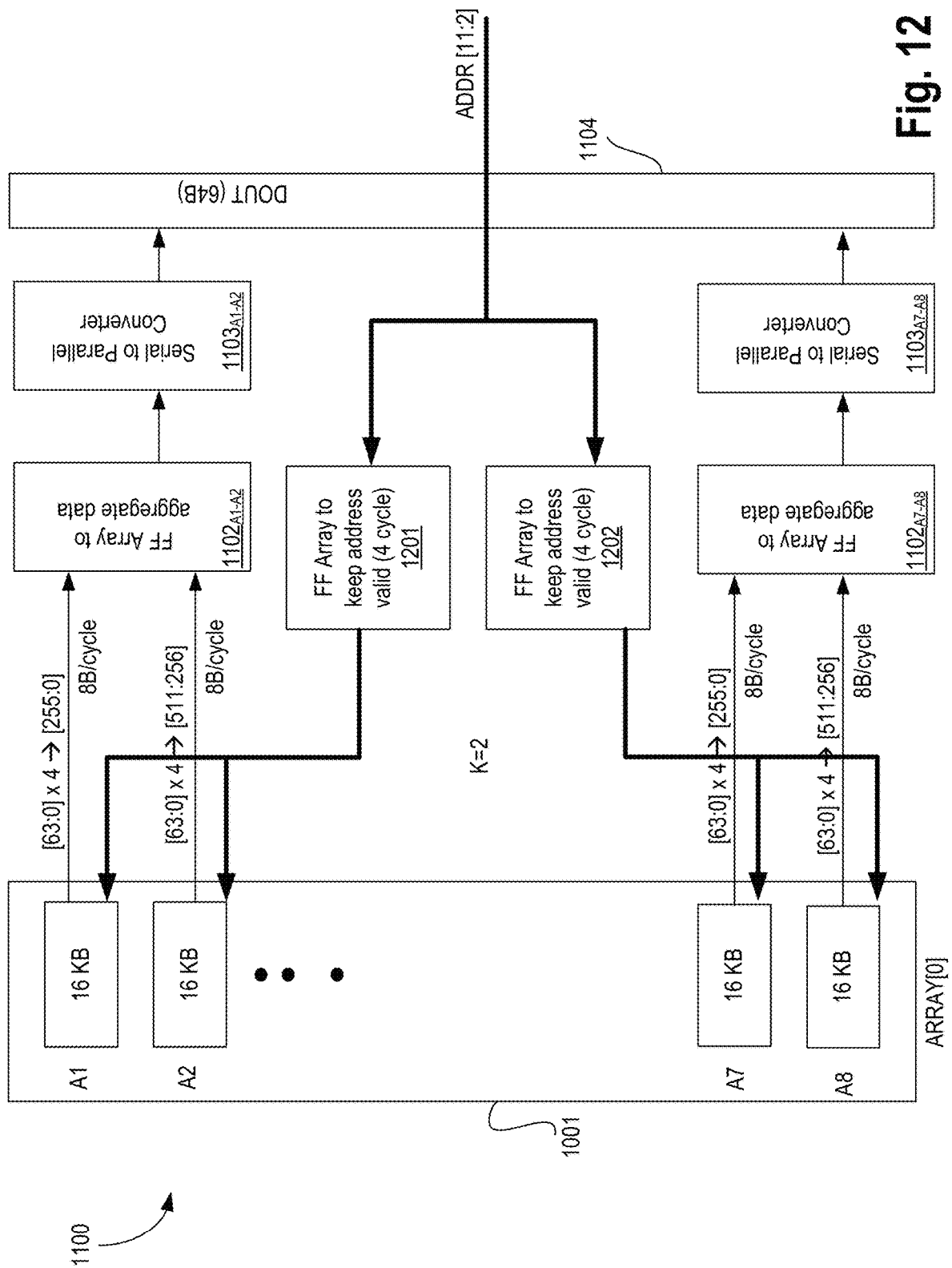
FIG. 12 illustrates a memory architecture with pipelining of four parallel read memory access, in accordance with some embodiments.

FIG. 12 illustrates memory architecture 1200 with pipelining of four parallel read memory access, in accordance with some embodiments. FIG. 12 shows that maximum of 8/K parallel accesses can be supported. Each agent can access K sub-arrays in parallel and a total of 8/K agents can achieve bandwidth same as the baseline which is 64B/cycle.

Two LSBs (which are removed from address due to implicit 4 cycle accesses), can be now re-used to enable 4 parallel accesses—with one access per a group of two subarrays. Besides the read-data flop banks (e.g., $1102_{A1-A2}$, $1102_{A7-A8}$) and associated serial-to-parallel converters (e.g., $1103_{A1-A2}$, $1103_{A7-A8}$), which are repeated now 4 times, an address flop bank (e.g., 1201) is used per sub-array group to keep its address stable for 4 cycles. Hence, with K=2 and S=8, there will be four flop-arrays to store addresses (1201, 1202, and two more (not shown)). The data obtained over 4 cycles are aggregated and provided to DOUT. Similarly for write operation, data is disaggregated to be written over 4 cycles, which also requires additional flop array. This is not shown in FIG. 12 for brevity purpose. In some embodiments, de-aggregator takes 64B of data and coverts into chunks of 16B and completes write operation over 4 cycles.

Table 2 illustrates comparison between read operation by architecture 1000 and 1400.

TABLE 2

| Design | Latency | Bandwidth (BW) | Data Aggregation required | Additional Addressing | Intrinsic Correlation |
|---|---|---|---|---|---|
| Design of FIG. 10 | X | 1 | no | No | No |
| Design of FIG. 12 | X + 8/K − 1 | 1 | YES Logic overhead sequential overhead of 96 B | YES Additional address bits: log (8/K) − 2 Additional Sequence: 10 + log(8/K) + 5b × (8/K) × (8/K) × 5 | Yes |

Table 2 shows that address bus size increases by log(8/K)−2 bits and additional flops (e.g., 1101) for storing address over 8/M cycles (10+log(8/K)+5b)×(8/K)×(8/K)×5. In Table 2, a generic equation is used with respect to K. However, data aggregation overhead can be 192B, where 96B is merely for read operation and 96B is used for write operation.

Figure 13:
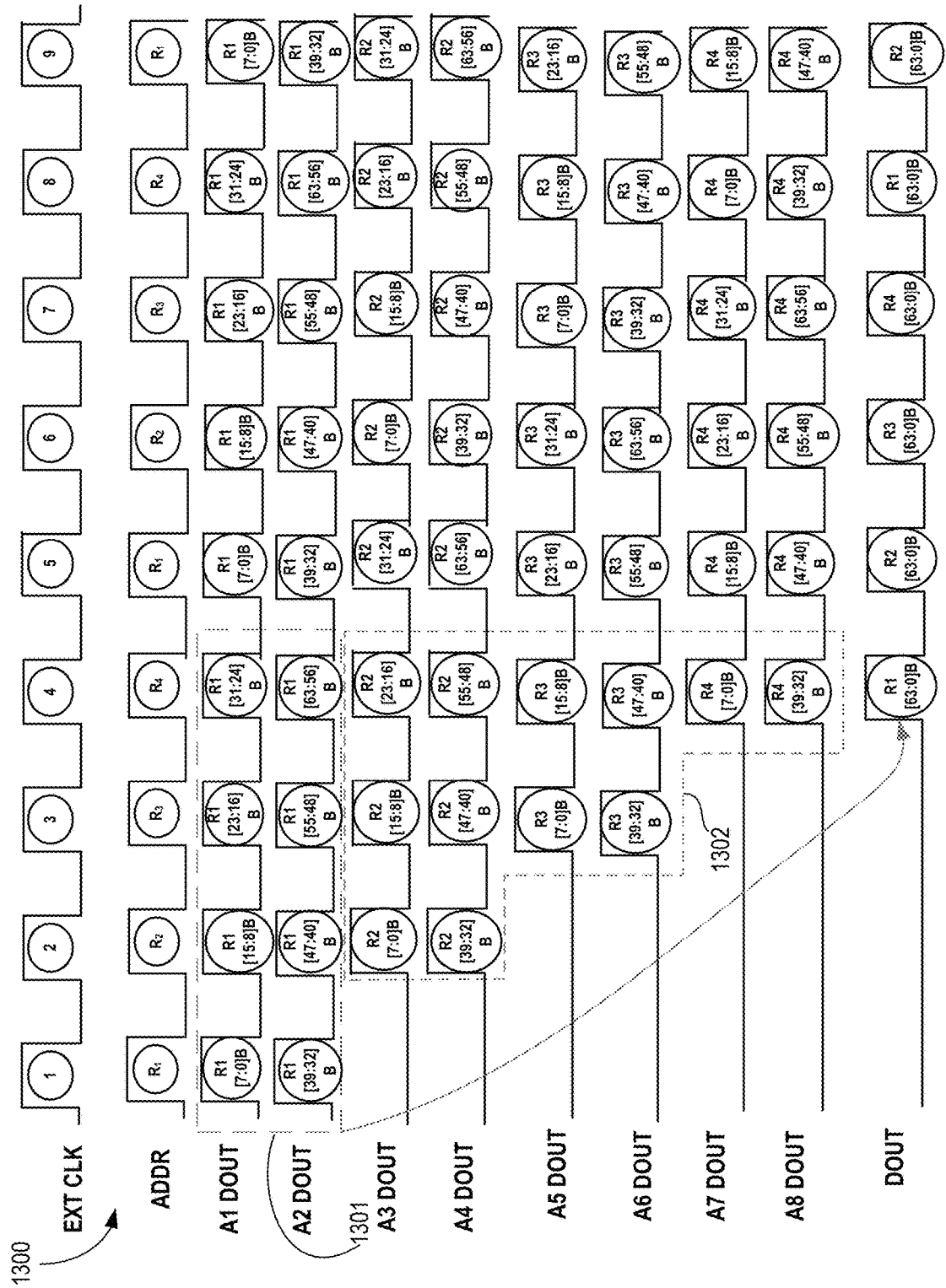
FIG. 13 illustrates a timing diagram for write and read operations with K=2, in accordance with some embodiments.

FIG. 13 illustrates timing diagram 1300 for write and read operations with K=2, in accordance with some embodiments. The scheme of various embodiments allows the use of energy efficient burst mode while providing ISO bandwidth as the baseline since 64B of data can be read/written every cycle, latency of a memory accesses is increased by 3-cycles which gives an example timing for 4 parallel burst reads.

In timing diagram 1300, dotted box 1301 shows a three cycle latency while box 1302 shows the additional flop overhead for storing temporary DOUT: (6+4+2)×8B=96B. The maximum throughput remains same as the baseline design of FIG. 10 i.e., 64 B/cycle. Latency increases by three cycles. Note, that latency increase is with respect to time when read access is issued. However, due to parallel nature of access, multiple read operations can be issued in the same cycle thus reducing effective latency.

Table 3 gives a summary comparison between the baseline and proposed architecture (for K=2) in terms of bandwidth, latency, and overhead associated with address and data flopping.

TABLE 3

| Design | Latency | Maximum Bandwidth (BW) per cycle | Additional flop array for data (read and write) | Additional flop array for address (read and write) |
|---|---|---|---|---|
| Design of FIG. 11 | X | 64 B | 0 | 0 |
| Design of FIG. 13 | X + 3 | 64 B | 192 B | 24 B |

Figure 14:
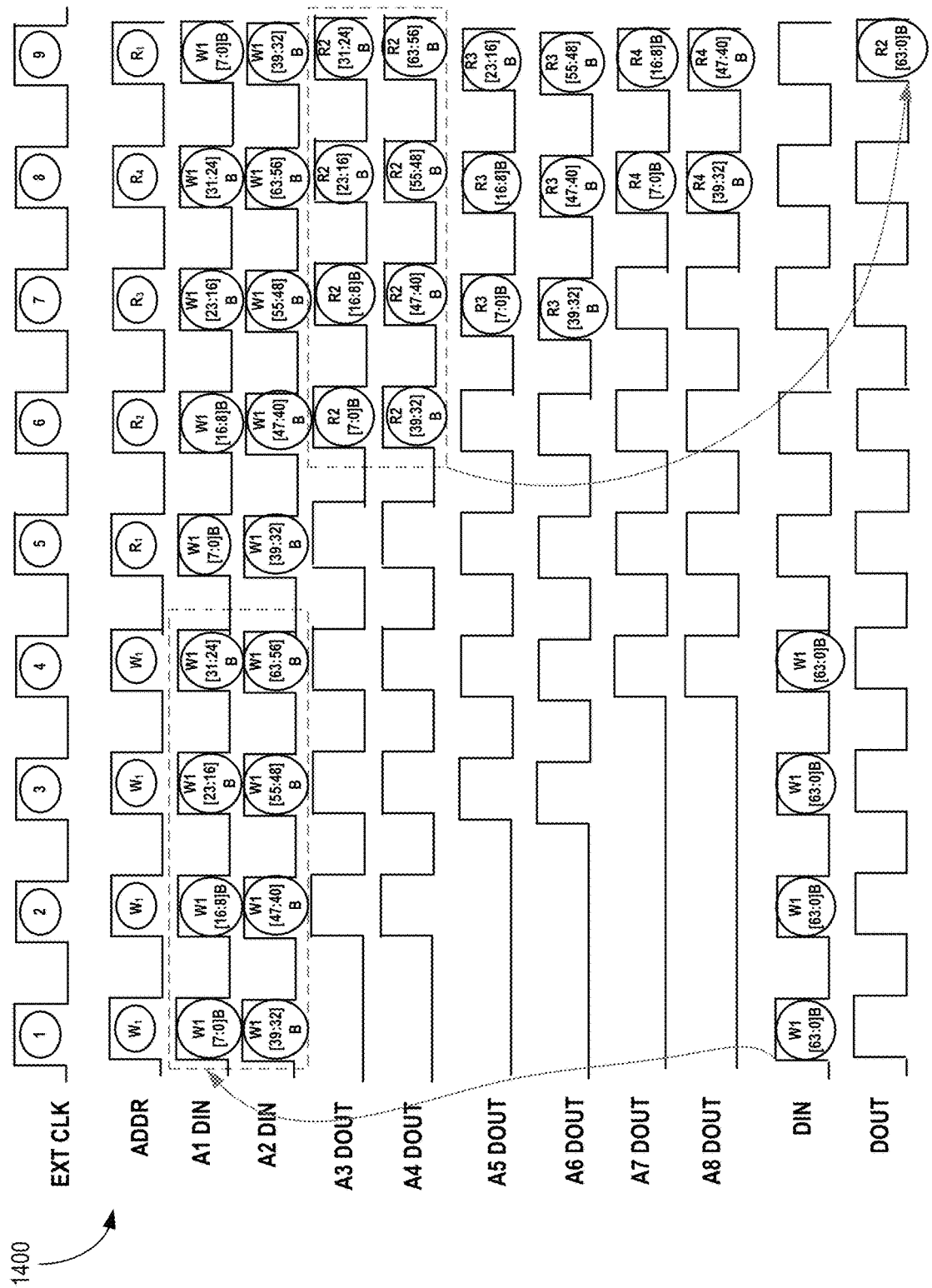
FIG. 14 illustrates a timing diagram for four parallel burst read and write operations from 4 sub-array groups, in accordance with some embodiments.

FIG. 14 illustrates timing diagram 1400 for four parallel burst read and write operations from 4 sub-array groups, in accordance with some embodiments. Here, sequential for storing temporary input data DIN is 160 B (e.g., 64B+48B+32B+16B); sequential for storing temporary output data DOUT is 160 B (e.g., 64B+48B+32B+16B); sequential in baseline (FIG. 10) for DIN and DOUT=64 B+64 B; and sequential overhead for storing DIN and DOUT is 192B (160 B+160B−64B−64B). Here, the term "temporary" generally refers to the condition that data residing in an additional 192B is not complete data and is still being aggregated. As such, storing temporary data is like using a scratch pad memory or buffer memory until data is aggregated.

Figure 15:
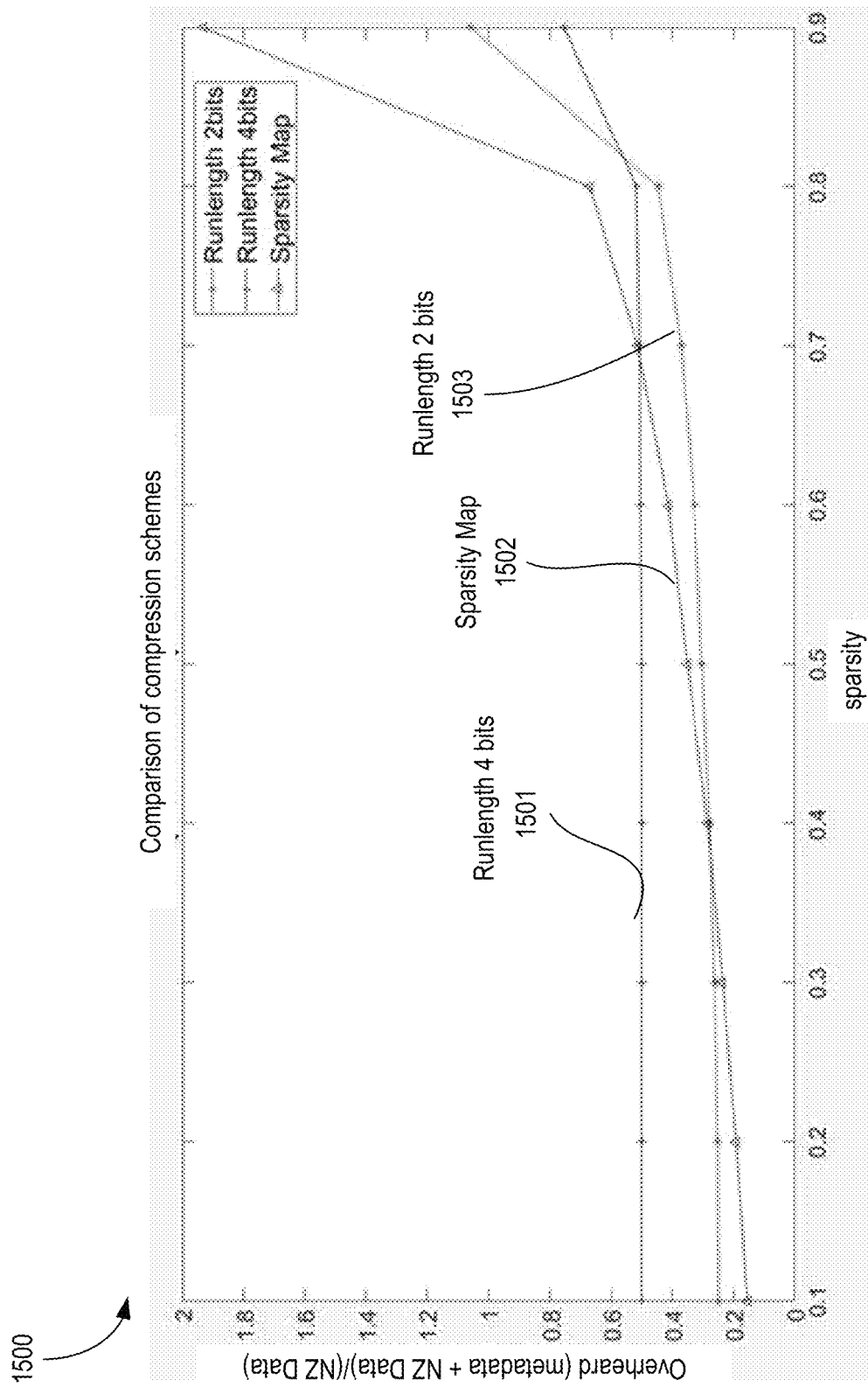
FIG. 15 illustrates a plot comparing compression schemes.

FIG. 15 illustrates plot 1500 comparing compression schemes. To avoid power and/or performance overhead in bringing weights from dynamic random access memory (DRAM) and/or other high bandwidth memory (HBM) to on-die memory (e.g., SRAM), compute-near-memory deep learning inference accelerators target to store all the weights in the on-die SRAM. About 90% of the weights are sparse. As such, in some embodiments, weights are stored in a compressed format along with the metadata, which is used for decompression. Plot 1500 shows why an inference accelerator uses a scheme similar to 4-bit run-length encoding (waveform 1501) for storing the weight matrices, which are 90% sparse. Compared to a sparsity map (waveform 1502) or a 2-bit run-length encoding (waveform 1503), the 4-bit Run-Length encoding (waveform 1501) has lower overhead, measured as the size of (metadata+size of non-zero weights)/(size of non-zero weights) at the sparsity level (90%) that is targeted by an inference accelerator for neural machine translation tasks.

Figure 16:
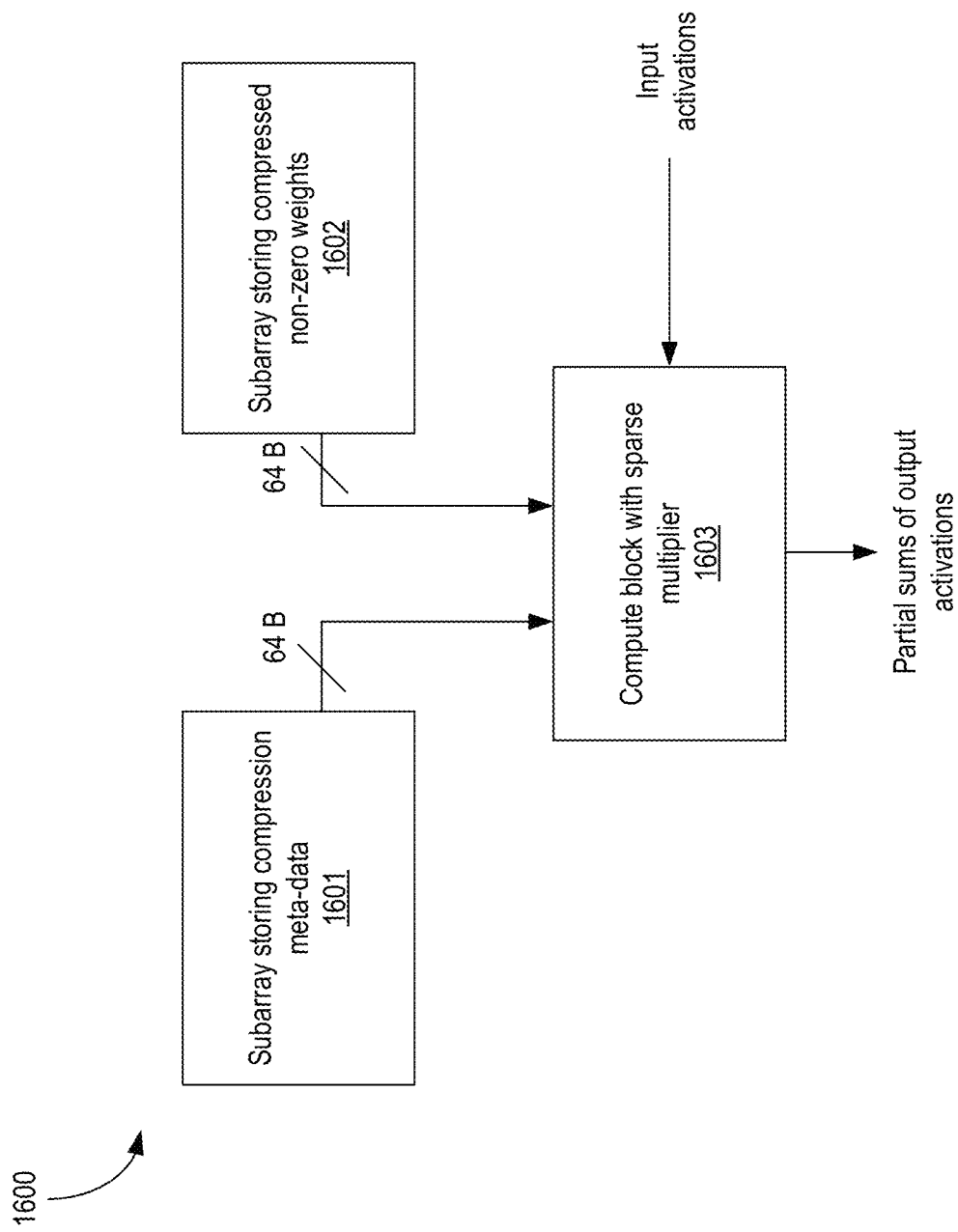
FIG. 16 illustrates a baseline scheme for multiplication.

FIG. 16 illustrates baseline scheme 1600 for multiplication. Here, metadata is compressed and stored in memory subarray 1601 while non-zero (NZ) eights are compressed in stored in subarray 1602. The 64 B from multiple subarrays is then input to compute block with sparse multiplier that uses the metal-data, non-zero eights and input activations to generate partial sums of outputs. Note, in this example, each sub-array can provide 64b and hence for 64B 8 sub-arrays are accessed. The size of subarray and bits are shown as an example. Any other size (other than 64B) can be used.

Figure 17:
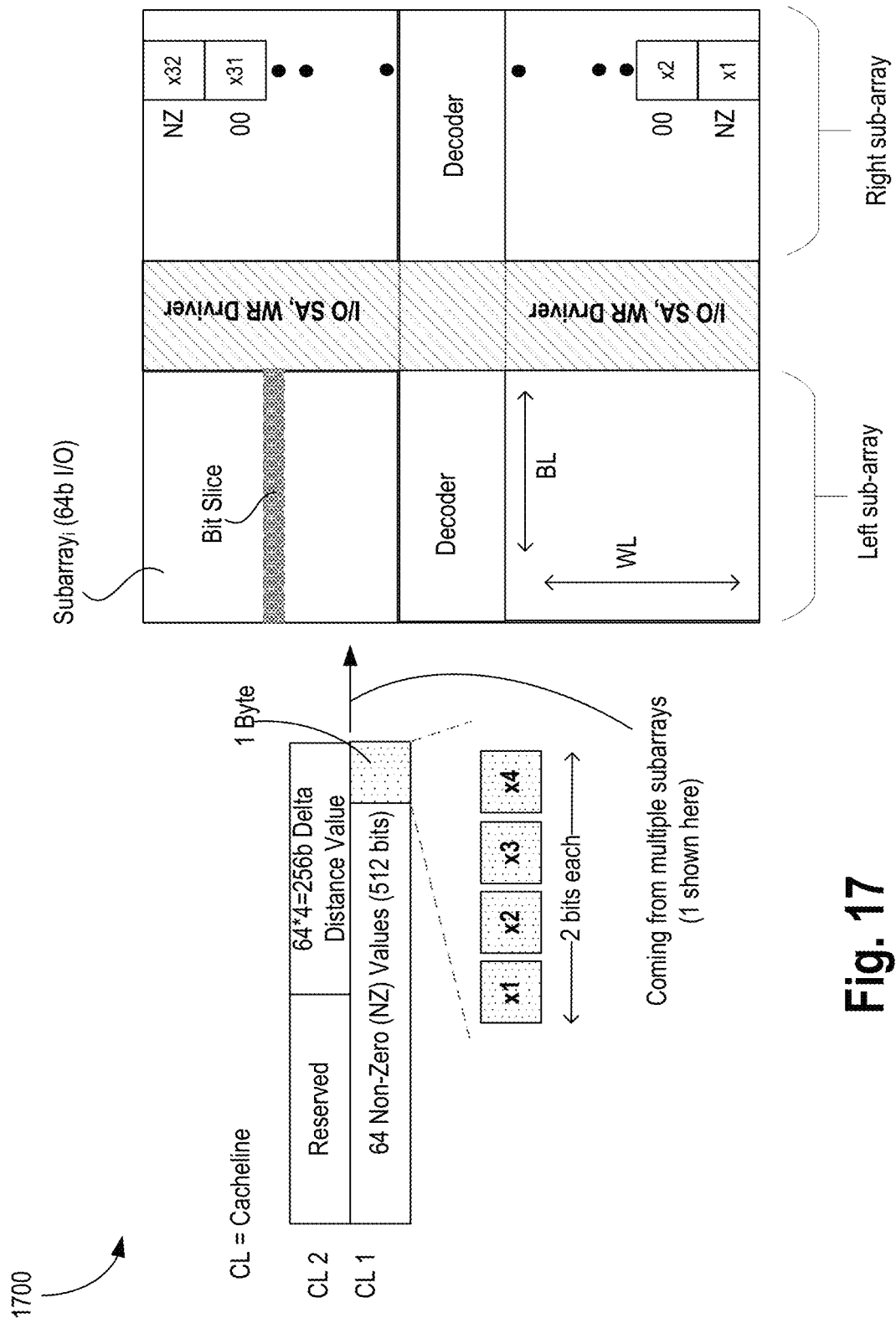
FIG. 17 illustrates a baseline scheme for storing compressed data (CL 1) and meta data (CL 2).

FIG. 17 illustrates baseline scheme 1700 for storing compressed data (CL 1) and meta data (CL 2). Here, the overhead is less than 2×, suggesting that there are some memory space which can remain unused. In the baseline scheme 1700, a first cache-line CL1 stores the compressed non-zero weights while a second cache-line CL2 stores the 4-bit run-length distance (e.g., 64*4=256b distance value). Each subarray stores zero and non-zero weights.

For 1B non-zero weight, 4b run-length information is stored. Thus for 64B cache line, 32B is used to store the run-length information. The metadata and the cache line is read in the same clock cycle, the weights are decoded and passed onto the compute block for performing multiplication with incoming activations.

Figure 18:
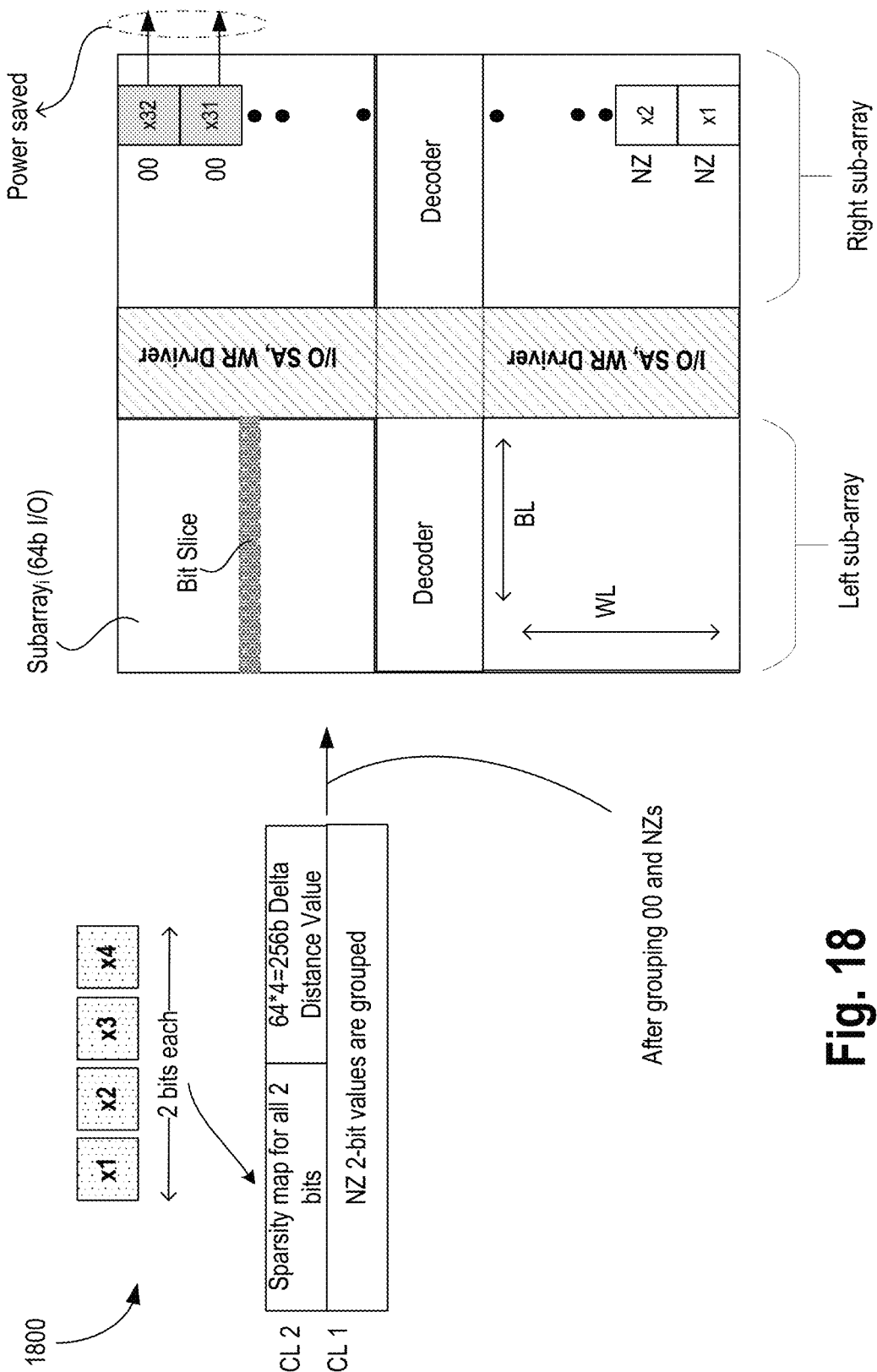
FIG. 18 illustrates a low power scheme that uses unused metadata to store a sparsity map, in accordance with some embodiments.

FIG. 18 illustrates low power scheme 1800 that uses unused metadata to store a sparsity map, in accordance with some embodiments. In various embodiments, the unused metadata is stored a sparsity map. For example, each 1B weight is divided into 4 groups of 2 bits. The bits can be either zero (00) or non-zero (01,10,11), which is known before the weights are fetched from off-die memory to on-die SRAM. Various embodiments group the non-zero (NZ) bits together, either near the upper or lower half of the SRAM subarray where they are stored. The zero (Z) bits are stored in the alternate half of the memory. The unused metadata bits (32B in this case) can be used to store a sparsity map which indicates whether each 2b group is zero/non-zero. For every 1B weight, 4 such sparsity bits are used and hence for 64B cache line, 32B sparsity map are used which fits into the 32B unused metadata space. In the case where unused metadata space is smaller than 32B, each 1B weight is divided into groups of 2 (instead of 4 groups), thus requiring less sparsity bits.

During runtime, the cache-line with metadata is read 1 cycle earlier from the left subarray, followed by the cache line with non-zero weights in the next cycle. The sparsity bits are then used to decide whether an entire subarray needs to be read or merely upper/lower half can be read. If the number of 00 (Z) 2-bit patterns is more than 50% of 1B weights, the upper/lower half of a subarray will be storing only 0s and therefore there is no need to read them.

Figure 19:
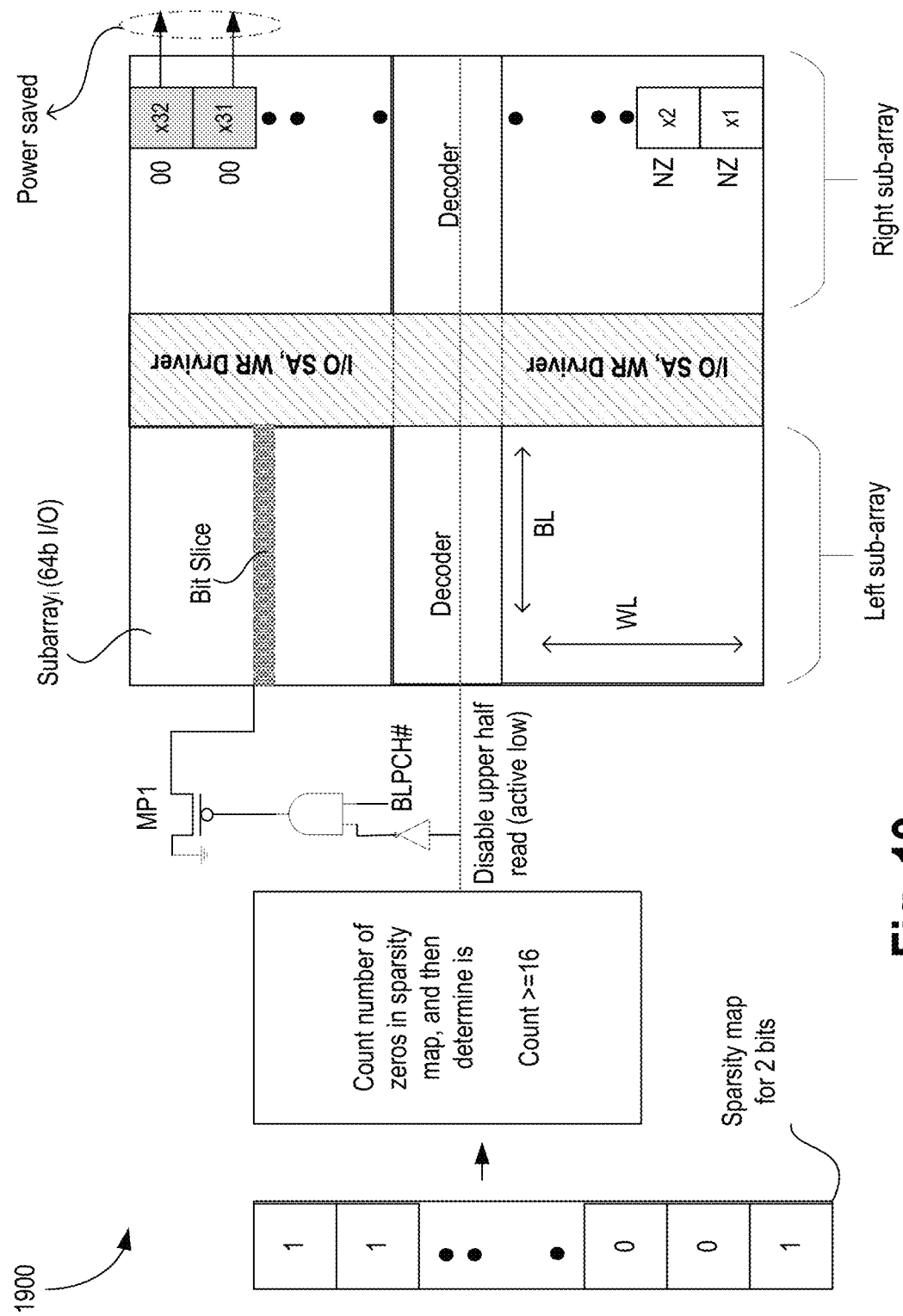
FIG. 19 illustrates a memory architecture read operation is prevented from where upper and lower haves of the subarray, in accordance with some embodiments.

FIG. 19 illustrates memory architecture 1900 where read operation is prevented from upper and lower halves of the subarray, in accordance with some embodiments. The scheme or architecture 1900 is shown for a single subarray (with 64b output). The same scheme extended for 8 subarrays to give savings for 64B cache-line. The number of 0s in the sparsity bit is counted. If the count is 16 or more, then it means the upper half is packed with zero 2-bit groups. The upper half read is then disabled by disabling BLPCH (bit-line pre-charge) and/or disabling WL, SAEN (sense-amp enable) and SAPCH (sense-amp pre-charge). As seen in FIG. 19, the scheme of various embodiments may not need any modification to the bit-cell array. Merely one and two additional logic gates are introduced in the WL enable and BLPCH paths, respectively. Typical sub-arrays already have separate control signals for WL to top-half and bottom-half due to signal slope (slew) constraints. Same constraint is also applicable for SAEN and SAPCH as well.

Hence, implementing the feature of various embodiments, has negligible overhead as mentioned earlier. During read-operation from sub-array, most of the energy is consumed in the BL and SA (sense-amp). By disabling them completely in the upper or lower-half, the energy contribution is reduced to zero. Hence, energy for reading (Cdyn) sub-array is halved (50% reduction). Additionally, with more sparsity, top and bottom halves can be further sub-divided, potentially increasing energy savings further, with the overhead of controlling BL/SAEN/SAPCH/BLPCH at higher granularity. In addition to the energy savings in the sub-array, data-bus driven by sub-array is also not switching, hence improving the total energy savings in the system.

Figure 20:
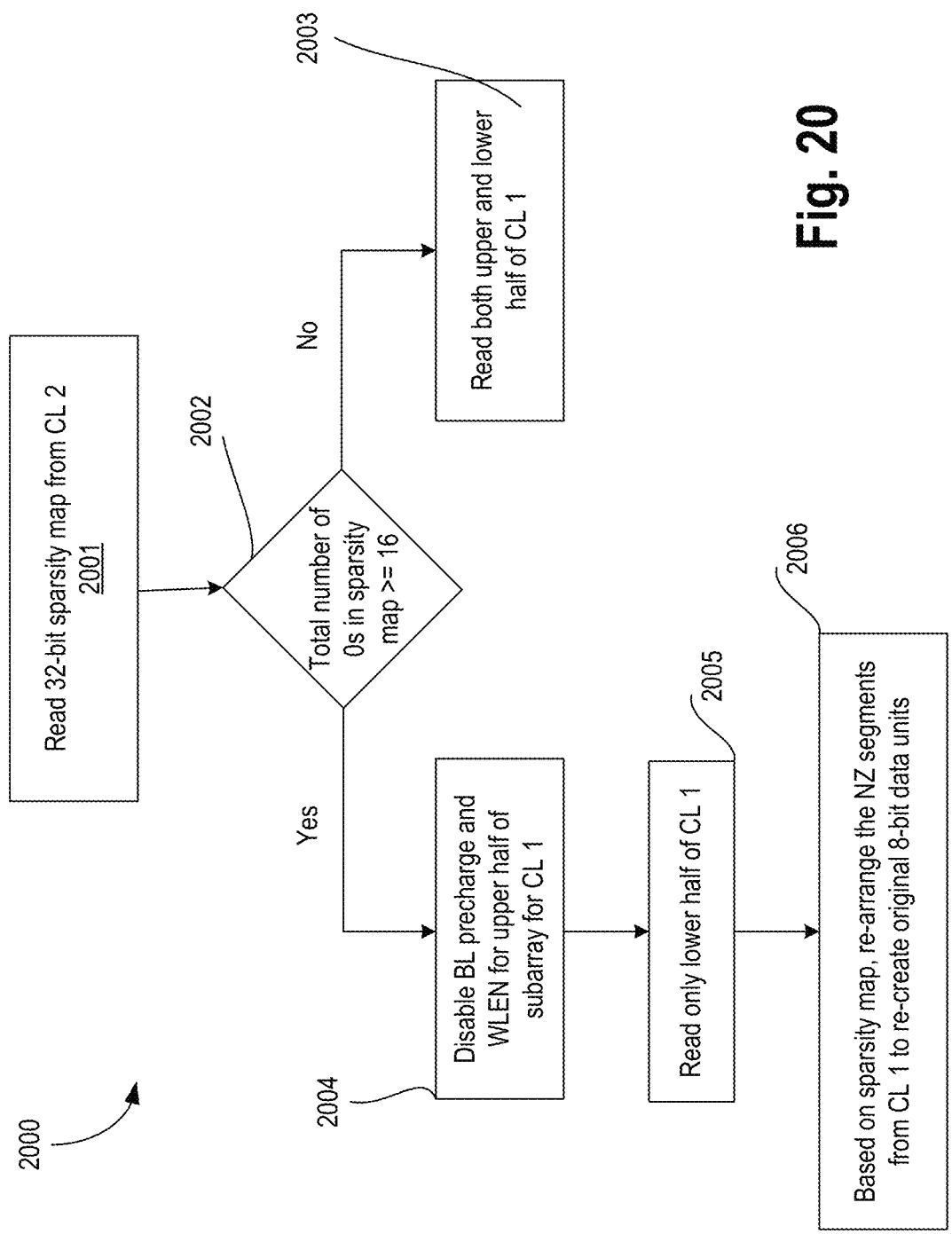
FIG. 20 illustrates a flowchart of a method for reading data from the re-arranged memory subarray where unused metadata is stored a sparsity map, in accordance with some embodiments.

FIG. 20 illustrates flowchart 2000 of a method for reading data from the re-arranged memory subarray where unused metadata is stored a sparsity map, in accordance with some embodiments. Various blocks in flowchart 2000 are shown in a particular order. However, the order can be modified. For example, some blocks can be performed before other, and some blocks can be performed in parallel or simultaneously. At block 2001, sparsity map (e.g., 32-bit map) is read a second cache-line (CL2). At block 2002, a determination is make regarding the number of zeros in the sparsity map relative to a threshold (e.g., greater or equal to 16). If the number of zeros in the sparsity is less than 50% (e.g., 16 for a 32-bit map) of the size of the sparsity map size, then the process proceeds to block 2203. At block 2001, upper and lower halves of a first cache-line (CL1) is read.

If the number of zeros in the sparsity is more or equal than 50% (e.g., 16 for a 32-bit map) of the size of the sparsity map size, then the process proceeds to block 2004. At block 2004, BL pre-charge is disabled, and word-line is enabled (WLEN=1) for the upper half of subarray for CL1. The process then proceeds to block 2205. At block 2005, lower half of CL1 is read. At block 2005, non-zero segments from CL1 are rearranged to recreate original 8-bit data units. The re-arranging of the non-zero segments is based on the sparsity map.

Figure 21:
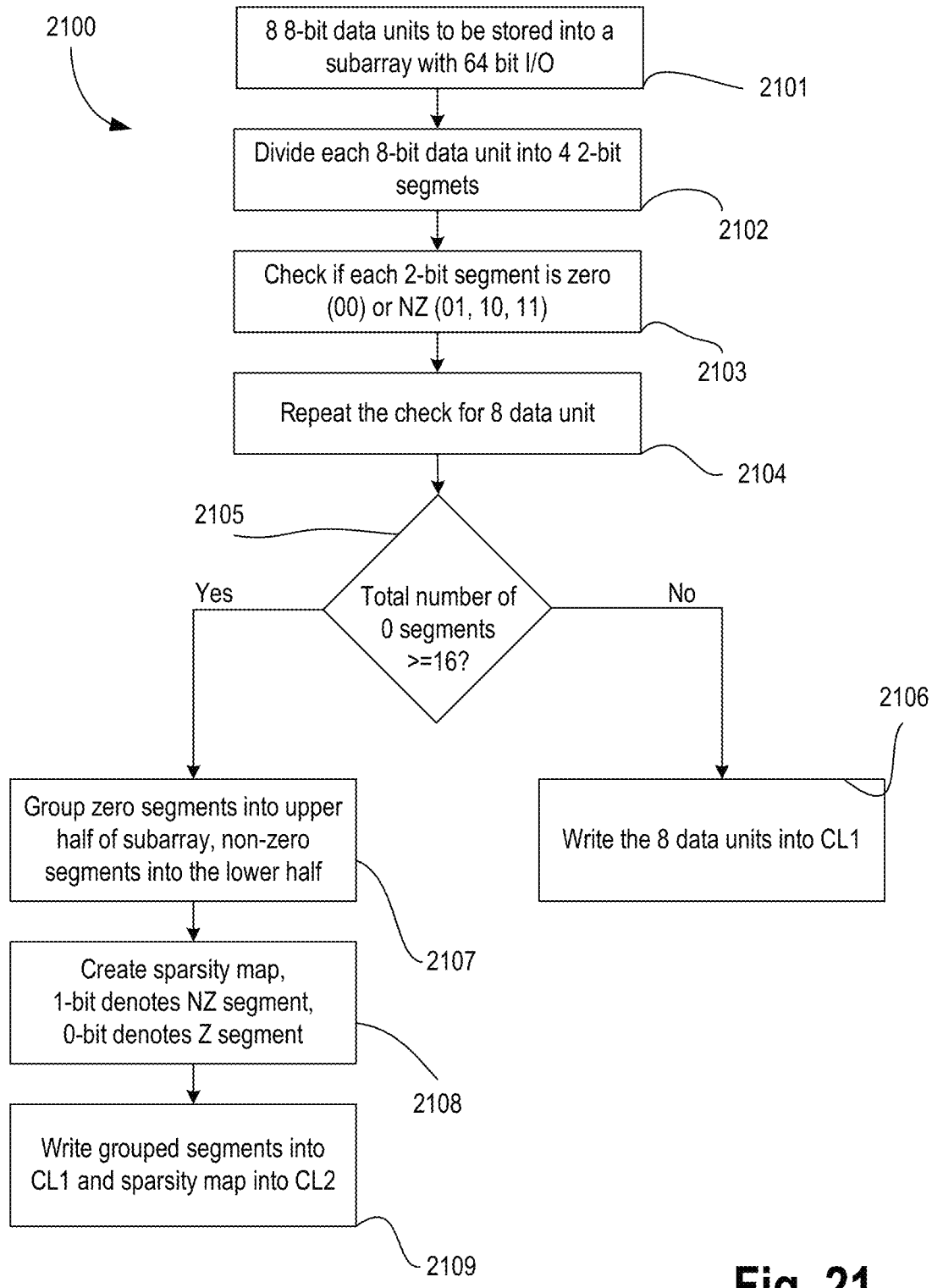
FIG. 21 illustrates a flowchart of a method for writing data to the memory subarray where unused metadata is stored a sparsity map, in accordance with some embodiments.

FIG. 21 illustrates flowchart 2100 of a method for writing data to the memory subarray where unused metadata is stored a sparsity map, in accordance with some embodiments. Various blocks in flowchart 2100 are shown in a particular order. However, the order can be modified. For example, some blocks can be performed before another, and some blocks can be performed in parallel or simultaneously. At block 2101, data units are stored in subarray. For example, eight 8-bit data units are stored in subarray with 64 bit I/O. At block 2102, each data unit is divided into bit segments. For example, each 8-bit data unit is divided into 4 2-bit segments. At block 2103, the segments are checked for zero or non-zero value. For example, it is determined whether each 2-bit segment is zero (00) or NZ (01, 10, 11). At block 2104, the process of checking for zero and non-zero is repeated for the data units (e.g., 8 data units). At block 2105, a determination is made about the total number of zero segments relative to a threshold (e.g., 50% of the size of sparsity map). For instance, a determination is made whether the total number of zero segments is greater or equal to 16 (when sparsity map is 32). If the total number of zero is less than the threshold (e.g., 16), then the processor proceeds to block 2306. At block 2106, the data units (e.g., 8 units) are writing into CL1.

If the total number of zeros is greater or equal than the threshold (e.g., 16), the process proceeds to block 2107. At block 2107, zero segments are grouped into upper half of subarray while non-zero segments are grouped into lower half. At block 2108, a sparsity map is created. In the map, 1 bit denotes NZ segment and 0 bit denotes zero segment. At block 2109, the grouped segments are written to CL1 and sparsity map is written into CL2.

Flowcharts 2000 and/or 2100 can be performed by hardware, software, or a combination of both. For example, the flowcharts can be performed by memory controller logic or particular finite state machine implemented in hardware.

Elements of embodiments (e.g., flowcharts 2000 and/or 2100, and schemes described with reference to various figures) are also provided as a machine-readable medium (e.g., memory) for storing the computer-executable instructions (e.g., instructions to implement any other processes discussed herein). In some embodiments, computing platform comprises memory, processor, machine-readable storage media (also referred to as tangible machine-readable medium), communication interface (e.g., wireless or wired interface), and network bus coupled together as shown.

In some embodiments, the processor is a Digital Signal Processor (DSP), an Application Specific Integrated Circuit (ASIC), a general purpose Central Processing Unit (CPU), or a low power logic implementing a simple finite state machine to perform the method of flowcharts 2000 and/or 2100 and/or various embodiments, etc.

In some embodiments, the various logic blocks are coupled via network bus. Any suitable protocol may be used to implement network bus. In some embodiments, machine-readable storage medium includes instructions (also referred to as the program software code/instructions) for calculating or measuring distance and relative orientation of a device with reference to another device as described with reference to various embodiments and flowchart.

Program software code/instructions associated with flowcharts 2000 and/or 2100 (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowcharts 800/ 900 (and/or various embodiments) are executed by the system.

In some embodiments, the program software code/instructions associated with flowcharts 2000 and/or 2100 (and/or various embodiments) are stored in a computer executable storage medium and executed by the processor. Here, computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer-to-peer networks and the like, including the Internet. Different portions of the software program code/instructions and data can be obtained at different times and in different communication sessions or in the same communication session.

The software program code/instructions (associated with flowcharts 2000 and/or 2100 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine-readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine-readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 22:
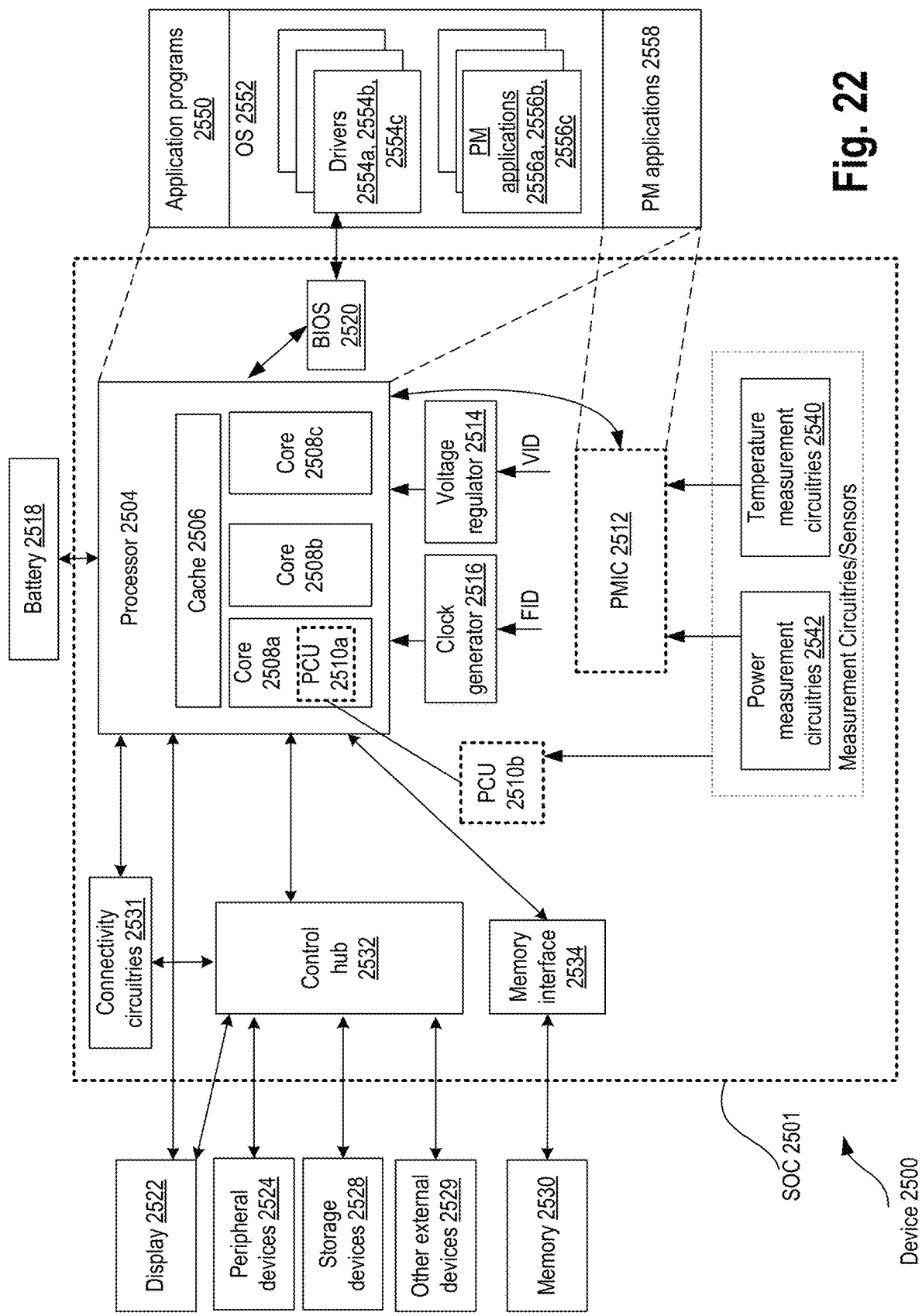
FIG. 22 illustrates a smart device, or a computer system, or a SoC (System-on-Chip) with energy efficient SRAM array with optimized burst read and write data access, and/or memory power saving scheme that uses reserved metadata bits in compressed weight storage, according to some embodiments of the disclosure.

FIG. 22 illustrates a smart device, or a computer system, or a SoC (System-on-Chip) with energy efficient SRAM array with optimized burst read and write data access, and/or memory power saving scheme that uses reserved metadata bits in compressed weight storage, according to some embodiments of the disclosure.

In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here that have memory (e.g., SRAM) can have energy efficient SRAM array with optimized burst read and write data access, and/or memory power saving scheme that uses reserved metadata bits in compressed weight storage.

In an example, the device 2500 comprises a SoC (System-on-Chip) 2501. An example boundary of the SOC 2501 is illustrated using dotted lines in FIG. 22, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 may be shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions may be fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508*a*, 2508*b*, 2508*c*, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510*a/b* and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510*a*. In an example, some other sections of PCU 2510 may be implemented outside the processing cores 2508, and these sections of PCU 2510 are symbolically illustrated using a dotted box and labelled as PCU 2510*b*. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556a, 2556b, 2556c. The OS 2552 may also include various drivers 2554a, 2554b, 2554c, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a first logic to determine whether burst mode is enabled for reading and/or writing data from or to a memory, wherein the memory includes a portion having N number of slices; wherein each slice includes M bit-cells coupled to bit-line (BL), inverse of bit-line (BL #), column write selectors, and read selectors; wherein a bit-cell from each slice is controllable by word-line; and a second logic to generate one pre-charge pulse and one word-line pulse for the N number of slices to perform M number of read operations after it is determined that the burst mode is enabled.

Example 2: The apparatus of example 1, wherein the second logic is to generate M number of pre-charge pulses for the N number of slices to perform M number of read operations after it is determined that the burst mode is disabled.

Example 3: The apparatus of example 1, wherein N is equal to 64, and M is equal to 4.

Example 4: The apparatus of example 1 comprises a third logic to determine whether equalization mode is enabled prior to writing data to the memory.

Example 5: The apparatus of example 3, comprises a fourth logic to equalize bit-lines prior to writing data to the memory if the equalization mode is enabled.

Example 6: The apparatus of example 1 comprises fifth logic to generate one pre-charge pulse and one word-line pulse, for M number of write operations, to the N number of slices.

Example 7: The apparatus of example 1, comprises sixth logic to generate M number of write operations to the N number of slices.

Example 8: A machine-readable storage media having machine-readable instructions that, when executed, cause one or more processors to perform an operation comprising: determine whether burst mode is enabled for reading and/or writing data from or to a memory, wherein the memory includes a portion having N number of slices, wherein each slice includes M number of columns and each column includes P number of bit-cells coupled to bit-line (BL), inverse of bit-line (BL #), column write selectors, and read selectors; wherein a bit-cell from each slice is controllable by word-line; and generate one pre-charge pulse and one word-line pulse for the N number of slices to perform M number of read operations after it is determined that the burst mode is enabled.

Example 9: The machine-readable storage media of example 8, having machine-readable instructions that, when executed, cause the one or more processors to perform a further operation comprising: generate M number of pre-charge pulses for the N number of slices to perform M number of read operations after it is determined that the burst mode is disabled.

Example 10: The machine-readable storage media of example 8, wherein N is equal to 64, M is equal to 4, and P is equal to 256.

Example 11: The machine-readable storage media of example 8, having machine-readable instructions that, when executed, cause the one or more processors to perform a further operation comprising: determine whether equalization mode is enabled prior to writing data to the memory.

Example 12: The machine-readable storage media of example 11, having machine-readable instructions that, when executed, cause the one or more processors to perform a further operation comprising: equalize bit-lines prior to writing data to the memory if the equalization mode is enabled.

Example 13: The machine-readable storage media of example 8, having machine-readable instructions that, when executed, cause the one or more processors to perform a further operation comprising: generate one pre-charge pulse and one word-line pulse, for M number of write operations, to the N number of slices.

Example 14: The machine-readable storage media of example 8, having machine-readable instructions that, when executed, cause the one or more processors to perform a further operation comprising: generate one word-line pulse to write N number of slices.

Example 15: The machine-readable storage media of example 8, having machine-readable instructions that, when executed, cause the one or more processors to perform a further operation comprising: generate one word-line pulse for M number of write operations, to the N number of slices.

Example 16: A system comprising: a memory; a processor coupled to the memory; a memory controller coupled to the memory, wherein the memory controller includes: a first logic to determine whether burst mode is enabled for reading and/or writing data from or to a memory, wherein the memory includes a portion having N number of slices; wherein each slice includes P bit-cells coupled to bit-line (BL), inverse of bit-line (BL #), column write selectors, and read selectors; wherein a bit-cell from each slice is controllable by word-line; and a second logic to generate one pre-charge pulse and one word-line pulse for the N number of slices to perform M number of read operations after it is determined that the burst mode is enabled; and a wireless interface to allow the processor to communicate with another device.

Example 17: The system of example 16, wherein the second logic is to generate M number of pre-charge pulses for the N number of slices to perform M number of read operations after it is determined that the burst mode is disabled.

Example 18: The system of example 16, wherein the memory controller comprises a third logic to determine whether equalization mode is enabled prior to writing data to the memory.

Example 19: The system of example 18, wherein the memory controller comprises a fourth logic to equalize bit-lines prior to writing data to the memory if the equalization mode is enabled.

Example 20: The system of example 16, wherein the memory controller comprises a fifth logic to generate one pre-charge pulse and one word-line pulse, for M number of write operations, to the N number of slices.

Example 21: A machine-readable storage media having machine readable instructions stored thereon, that when executed, cause one or more processors to perform a method comprising: reading sparsity map from a first cache-line; determining whether a number of zeros in the sparsity map is greater than a threshold; reading both upper and lower halves of a second cache-line if it is determined that the number of zeros in the sparsity map is less than the threshold; and disabling a bit-line pre-charge and write enable for the upper half of the second cache-line if it is determined that the number of zeros in the sparsity map is greater or equal than the threshold.

Example 22: The machine-readable storage media of example 21 having machine readable instructions stored thereon, that when executed, cause the one or more processors to perform the method comprising: reading the lower half of the second cache-line and not the upper half of the second cache-line if it is determined that the number of zeros in the sparsity map is greater or equal than the threshold.

Example 23: The machine-readable storage media of example 21 having machine readable instructions stored thereon, that when executed, cause the one or more processors to perform the method comprising: re-arranging non-zero segments from the second cache line in accordance with the sparsity map, if it is determined that the number of zeros in the sparsity map is greater or equal than the threshold, to create original data units.

Example 24: The machine-readable storage media of example 23, wherein the original data units are 8-bit data units.

Example 25: The machine-readable storage media of example 21, wherein the sparsity map is a 32-bit sparsity map.

Example 26: The machine-readable storage media of example 21, wherein the threshold is half of a size of the sparsity map.

Example 27: The machine-readable storage media of example 21, wherein the threshold is 16.

Example 28: A machine-readable storage media having machine readable instructions stored thereon, that when executed, cause one or more processors to perform a method comprising: storing N M-bit data units into a subarray with L-bit input/output (I/O); dividing each of the M-bit data units into N/2 2-bit segments; determining whether each of the 2-bit segments is zero or non-zero, and repeating the determining for the N data units; determining whether the number of zero segments is greater than a threshold; and writing the N data unit into a first cache-line if it is determined that the number of zero segments is greater than a threshold.

Example 29: The machine-readable storage media of example 28 having machine readable instructions stored thereon, that when executed, cause the one or more processors to perform the method comprising: grouping the zero segments into upper half of the subarray if it is determined that the number of zero segments is greater than the threshold; and grouping the non-zero segments into lower half of the subarray if it is determined that the number of zero segments is greater than the threshold.

Example 30: The machine-readable storage media of example 29 having machine readable instructions stored thereon, that when executed, cause the one or more processors to perform the method comprising: creating a sparsity map if it is determined that the number of zero segments is greater than the threshold; writing the grouped zero segments and the grouped non-zero segments into the first cache-line; and writing the sparsity map into a second cache-line.

Example 31: The machine-readable storage media of example 28, wherein N=8, M=8, and L=64.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a first logic configured to determine whether burst mode is enabled for writing data to a memory, wherein:
the memory includes N number of slices; and
each slice includes M number of bit cells coupled to a word line, and each of the M bit cells is also coupled to a bit line (BL), an inverse of bit line (BL #), write column selectors, and read column selectors;
a second logic configured to generate one pre-charge pulse and M word line pulses for the M bit cells of the N number of slices to perform M number of write operations after it is determined that the burst mode is enabled, wherein the one pre-charge pulse is applied to the M bit cells prior to applying the M word line pulses for the M bit cells;
a third logic configured to determine whether an equalization mode is enabled prior to writing data to the memory; and
a fourth logic configured to, for each of the M bit cells, equalize the bit line and the inverse bit line of the bit cell prior to writing data into the bit cell if the equalization mode is enabled.

2. The apparatus of claim 1, wherein the second logic is configured to generate M number of pre-charge pulses for the N number of slices to perform M number of write operations after it is determined that the burst mode is disabled.

3. The apparatus of claim 1, wherein N is equal to 64, and M is equal to 4.

4. The apparatus of claim 1, further comprising logic to generate M number of write operations for the N number of slices.

5. A non-transitory machine-readable storage media having machine-readable instructions that, when executed, cause one or more processors to:
determine whether burst mode is enabled for writing data to a memory, wherein the memory includes N number of slices, each slice includes M number of columns, and each column includes P number of bit cells coupled to a bit line (BL), an inverse bit line (BL #), write column selectors, and read column selectors, and M bit cells from each slice are controllable by a word line;
generate a single pre-charge pulse and M word line pulses for the M bit cells of the N number of slices to perform M number of write operations after it is determined that the burst mode is enabled, wherein the single pre-charge pulse is applied to the M bit cells prior to the M word line pulses for the M bit cells;
determine whether an equalization mode is enabled prior to writing data to the memory; and
for each of the M bit cells, equalize the bit line and the inverse bit line of the bit cell prior to writing data into the bit cell if the equalization mode is enabled.

6. The non-transitory machine-readable storage media of claim 5, wherein the machine-readable instructions, when executed, cause the one or more processors to generate M number of pre-charge pulses for the N number of slices to perform M number of write operations after it is determined that the burst mode is disabled.

7. The non-transitory machine-readable storage media of claim 5, wherein N is equal to 64, M is equal to 4, and P is equal to 256.

8. The non-transitory machine-readable storage media of claim 5, wherein the machine-readable instructions, when executed, cause the one or more processors to generate one word line pulse to write N number of slices.

9. The non-transitory machine-readable storage media of claim 5, wherein the machine-readable instructions, when executed, cause the one or more processors to generate one word line pulse for M number of write operations, to the N number of slices.

10. A system comprising:
a memory comprising a number M of columns, wherein each column comprises P bit cells coupled to a bit line (BL), an inverse bit line (BL #), write column selectors, and read column selectors, and a bit cell from each of the M columns is coupled to a word line; and
a memory controller coupled to the memory, wherein the memory controller is to:
determine whether a burst mode is enabled for writing data to the memory; and
perform a write operation for the bit cells coupled to the word line, wherein the write operation comprises application of a single pre-charge pulse to the bit line and inverse bit line of each of the M columns concurrent with equalization of the bit line and inverse bit line of each of the M columns, followed by application of a first pulse to the word line to write to a bit cell of a first column of the M columns, followed by equalization of the bit line and inverse bit line of a second column of the M columns, followed by application of a pulse to the word line to write to a bit cell of the second column of the M columns.

11. The system of claim 10, wherein the memory controller is to determine whether an equalization mode is enabled prior to writing data to the memory.

12. The apparatus of claim 1, wherein the memory comprises a static random-access memory (SRAM).

13. The apparatus of claim 1, wherein the one pre-charge pulse is applied to the bit line and inverse bit line of each of the M bit cells.

14. The apparatus of claim 1, wherein:
the bit line and the inverse bit line of each of the M bit cells are equalized prior to applying a first word line pulse of the M word line pulses to the word line; and
the bit line and the inverse bit line of one of the M bit cells at a time are equalized prior to applying a second word line pulse and later word line pulses of the M word line pulses to the word line.

15. The non-transitory machine-readable storage media of claim 5, wherein the machine-readable instructions, when executed, cause the one or more processors to:
for a first bit cell of the M bit cells, equalize the bit line and the inverse bit line of each of the M bit cells prior to writing data into the first bit cell if the equalization mode is enabled.

16. The non-transitory machine-readable storage media of claim 15, wherein the machine-readable instructions, when executed, cause the one or more processors to:
for a subsequent bit cell of the M bit cells, after the first bit cell, equalize the bit line and the inverse bit line of the subsequent bit cell but not of other bit cells of the M bit cells prior to writing data into the subsequent bit cell if the equalization mode is enabled.

17. The system of claim 10, wherein the memory comprises a static random-access memory (SRAM).

18. The system of claim 10, wherein in the write operation, after the equalization of the bit line and inverse bit line of each of the M columns, the bit line and inverse bit line of one column at a time are equalized prior to writing to the bit cell of the column with a pulse applied to the word line.

19. The system of claim 10, wherein in the write operation, after the application of the single pre-charge pulse to the bit line and inverse bit line of each of the M columns, no further pre-charge pulse is applied to the bit line and inverse bit line of each of the M columns.

20. The system of claim 10, wherein the memory controller is to assert a write column select signal for the first column during the application of the first pulse to the word line, and assert a write column select signal for the second column during the application of the second pulse to the word line.

* * * * *